United States Patent
Lee

(10) Patent No.: US 10,325,928 B2
(45) Date of Patent: Jun. 18, 2019

(54) METHOD OF MANUFACTURING THIN FILM TRANSISTOR, DEHYDROGENATING APPARATUS FOR PERFORMING THE SAME, AND ORGANIC LIGHT EMITTING DISPLAY DEVICE INCLUDING THIN FILM TRANSISTOR MANUFACTURED BY THE SAME

(71) Applicant: LG Display Co., Ltd., Seoul (KR)

(72) Inventor: Sung soo Lee, Goyang-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 15/595,463

(22) Filed: May 15, 2017

(65) Prior Publication Data

US 2017/0352688 A1 Dec. 7, 2017

(30) Foreign Application Priority Data

Jun. 2, 2016 (KR) .................. 10-2016-0068618

(51) Int. Cl.
*H01L 27/12* (2006.01)
*H01L 21/70* (2006.01)
(Continued)

(52) U.S. Cl.
CPC .... *H01L 27/1214* (2013.01); *H01L 21/02107* (2013.01); *H01L 21/02488* (2013.01); *H01L 21/02532* (2013.01); *H01L 21/02595* (2013.01); *H01L 21/02675* (2013.01); *H01L 21/707* (2013.01); *H01L 21/71* (2013.01); *H01L 27/1259* (2013.01); *H01L 29/0653* (2013.01); *H01L 29/66757* (2013.01); *H01L 29/786* (2013.01)

(58) Field of Classification Search
None
See application file for complete search history.

(56) References Cited

U.S. PATENT DOCUMENTS

| 6,235,122 B1* | 5/2001 | Zhang | H01L 21/02052 118/715 |
| 2005/0186721 A1* | 8/2005 | Miyashita | H01L 21/02675 438/197 |
| 2009/0186569 A1* | 7/2009 | Miura | F24F 12/006 454/66 |

FOREIGN PATENT DOCUMENTS

KR 10-2004-0039572 5/2004
KR 10-2006-0110582 10/2006

OTHER PUBLICATIONS

Kim, D.Y., et al., "Oxygen Effect on Laser Crystallization of Sputtered a-Si Film on Plastic Substrate," Japanese Journal of Applied Physics, 2006, pp. L74-L76, vol. 45, No. 3.

* cited by examiner

*Primary Examiner* — Bo B Jang
(74) *Attorney, Agent, or Firm* — Fenwick & West LLP

(57) ABSTRACT

Provided are a method of manufacturing a thin film transistor, a dehydrogenating apparatus for performing the method, and an organic light emitting display device including a thin film transistor manufactured by the same. A method of manufacturing a thin film transistor includes reducing a content of oxygen in a chamber for performing a dehydrogenation process of an amorphous silicon layer from a first value to a second value, inserting a substrate on which the amorphous silicon layer is formed into the chamber, heating the inside of the chamber to perform the dehydrogenation process on the amorphous silicon layer, and forming a polysilicon layer by crystallizing the amorphous silicon layer using a laser.

16 Claims, 15 Drawing Sheets

(51) Int. Cl.
*H01L 21/71* (2006.01)
*H01L 21/02* (2006.01)
*H01L 29/06* (2006.01)
*H01L 29/786* (2006.01)
*H01L 29/66* (2006.01)

METHOD OF MANUFACTURING THIN FILM TRANSISTOR, DEHYDROGENATING APPARATUS FOR PERFORMING THE SAME, AND ORGANIC LIGHT EMITTING DISPLAY DEVICE INCLUDING THIN FILM TRANSISTOR MANUFACTURED BY THE SAME

CROSS-REFERENCE TO RELATED APPLICATIONS

This application claims the priority of Republic of Korea Patent Application No. 10-2016-0068618 filed on Jun. 2, 2016, in the Korean Intellectual Property Office, the disclosure of which is incorporated herein by reference in its entirety.

BACKGROUND

Field

The present disclosure relates to a method of manufacturing a thin film transistor, a dehydrogenating apparatus for performing the method, and an organic light emitting display device including a thin film transistor manufactured by the same, and more particularly, to a method of manufacturing a thin film transistor, a dehydrogenating apparatus for performing the method, and an organic light emitting display device including a thin film transistor manufactured by the same with an improved film characteristic.

Description of the Related Art

A flat panel display device such as a liquid crystal display device, a plasma display panel device, and an organic light emitting display device is getting spotlight as a next generation display device due to a small thickness and low power consumption.

Specifically, the organic light emitting display device is a self-light emitting display device and does not need a separate light source unlike a liquid crystal display device. Thus, the organic light emitting display device can be manufactured into a lightweight and thin form. Further, the organic light emitting diode display device is advantageous in terms of power consumption since it is driven with a low voltage. Also, the organic light emitting diode display device has a high response speed, a wide viewing angle, and a high contrast ratio (CR). Therefore, the organic light emitting diode display device has been researched as a next-generation display device.

The organic light emitting display device includes an organic light emitting diode (OLED) and a thin film transistor connected to the organic light emitting diode. The organic light emitting display device emits light having a specific wavelength based on a driving current transmitted through the thin film transistor.

Since the intensity of light generated in the organic light emitting diode is proportional to an intensity of a driving current which is transmitted through the thin film transistor, brightness of a sub pixel including the organic light emitting diode may be adjusted by controlling an amount of the driving current transmitted through the thin film transistor.

However, during the process of manufacturing the thin film transistor, a film characteristic of an active layer of the thin film transistor may deteriorate and thus a device characteristic of the thin film transistor in the organic light emitting display device may not be uniform.

Specifically, the thin film transistor includes a polysilicon layer, a gate insulating layer on the polysilicon layer, a gate electrode which overlaps the polysilicon layer on the gate insulating layer, and a source electrode and a drain electrode which are connected to the polysilicon layer. The polysilicon layer may be formed of low temperature polycrystalline silicon (LTPS). The LTPS is formed by forming the amorphous silicon layer on the substrate and then crystallizing an amorphous silicon layer using a high energy laser.

The amorphous silicon layer may be formed by a plasma enhanced chemical vapor deposition (PECVD) method. The PECVD method is advantageous to enhance a processing speed and lower the cost of a thin film transistor manufacturing process since it has a low processing temperature and a fast deposition speed. However, when the amorphous silicon layer is formed using the PECVD, a silane gas ($SiH_4$) is used as a source gas. In this case, during the process of forming the amorphous silicon layer, a large amount of hydrogen may be contained in the amorphous silicon layer. Hydrogen has a high vapor pressure, so that the hydrogen may easily evaporate.

Specifically, when a high energy laser is irradiated onto the amorphous silicon layer during a process of forming the polysilicon layer by crystallizing the amorphous silicon layer, the amorphous silicon layer may be melted and the hydrogen may evaporate through a surface of the melted amorphous silicon layer. In this case, the hydrogen penetrates the surface of the melted amorphous silicon layer to make the surface rough and the melted amorphous silicon layer is crystallized to be hardened as it is, so that the polysilicon layer has a rough surface. The rough surface of the polysilicon layer interrupts the movement of charges through the polysilicon layer, which may deteriorate the device characteristics of the thin film transistor. In order to solve the above-described problem, a dehydrogenation process which removes hydrogen in the amorphous silicon layer is performed before crystalizing the amorphous silicon layer.

The dehydrogenation process is performed such that hydrogen from the amorphous silicon layer is escaped by applying heat of approximately 400° C. to the amorphous silicon layer. The hydrogen is removed through the dehydrogenation process so that the problem of degradation of the film characteristic due to hydrogen during the process of crystallizing the amorphous silicon layer may be solved. However, the film characteristic of the polysilicon layer may be degraded due to various elements being entered during the dehydrogenation process.

Specifically, the dehydrogenation process is performed by applying heat to the amorphous silicon layer in a chamber under a normal pressure environment (1 atm). However, the environment in the chamber cannot be controlled so that various hetero elements present in the chamber under the high temperature environment may react with the surface of the amorphous silicon layer and may be adsorbed thereon. After completing the dehydrogenation process, during the process of crystalizing the amorphous silicon layer, the hetero elements partially absorbs laser which crystallizes the amorphous silicon layer. Thus, the laser energy may not be uniformly transmitted into the amorphous silicon layer. In this case, when a phase of the amorphous silicon which is melted by the laser energy is transformed from a liquid phase to a solid phase, non-uniform nucleation and non-uniform crystal grain growth may be generated in the amorphous silicon layer. When the crystallization of the amorphous silicon layer is not uniformly performed, the film characteristic of the polysilicon layer is degraded and thus the device characteristic of the thin film transistor may also be degraded.

Specifically, a laser which crystallizes the amorphous silicon layer is irradiated onto the substrate in the form of lines with a constant interval so that the polycrystalline layer may have a line shaped rough surface. As a result, the device characteristic of the thin film transistors formed on the lines onto which the laser is irradiated may be degraded. Further, brightness of the organic light emitting diodes connected to the thin film transistors having the degraded device characteristic may be lower than that of the organic light emitting diode in other part. Accordingly, a striped stain may be generated in the organic light emitting display device and the quality of the organic light emitting display device may be degraded.

SUMMARY

The inventors of the present disclosure recognized that hetero elements in the chamber are adsorbed onto a surface of the amorphous silicon layer during the process of performing the dehydrogenation process to interrupt the crystallization of the amorphous silicon layer and degrade the film characteristic of the polysilicon layer. Accordingly, the inventors of the present disclosure invented a method of manufacturing a thin film transistor which controls an atmosphere in the chamber for performing the dehydrogenation process before performing the dehydrogenation process to minimize adsorption of hetero elements onto the surface of the amorphous silicon layer.

An object to be achieved by the present disclosure is to provide a method of manufacturing a thin film transistor, so that the uniformity and roughness of surface of the polysilicon layer is improved and enhanced by reducing an oxygen content in a chamber for performing a dehydrogenation process to a predetermined content, a dehydrogenating apparatus for performing the method, and an organic light emitting display device including a thin film transistor manufactured by the method. Further, another object to be achieved by the present disclosure is to provide a method of manufacturing a thin film transistor, having an enhanced device characteristic through improving a surface roughness of the polysilicon layer and forming substantially uniform a silicon crystal grain of the polysilicon layer, a dehydrogenating apparatus for performing the method, and an organic light emitting display device including a thin film transistor manufactured by the method.

Objects of the present disclosure are not limited to the above-mentioned objects, and other objects, which are not mentioned above, can be clearly understood by those skilled in the art from the following descriptions.

According to an aspect of the present disclosure, there is provided a method of manufacturing a thin film transistor. The method of manufacturing a thin film transistor includes reducing a content of oxygen in a chamber for performing a dehydrogenation process of an amorphous silicon layer to a predetermined content, inserting a substrate on which the amorphous silicon layer is formed into the chamber, heating the inside of the chamber to perform the dehydrogenation process on the amorphous silicon layer, and forming a polysilicon layer by crystallizing the amorphous silicon layer using a laser. The method of manufacturing a thin film transistor according to the exemplary embodiment of the present disclosure reduces the content of oxygen in the chamber for performing a dehydrogenation process to a predetermined content. Therefore, adsorption of oxygen and hetero elements onto the surface of the amorphous silicon layer during the dehydrogenation process may be minimized. Therefore, the polysilicon layer formed by crystallizing the amorphous silicon layer has a low surface roughness value (Rq) and has substantially uniform silicon grains. As a result, the thin film transistor formed of a polysilicon layer has an enhanced device characteristic.

According to another aspect of the present disclosure, there is provided a dehydrogenating apparatus for manufacturing a thin film transistor. The dehydrogenating apparatus includes a chamber, a substrate support, a gas supplying unit, and a gas exhausting unit. The chamber is a chamber for performing a dehydrogenation process which removes hydrogen of the amorphous silicon layer on the substrate. The substrate support is configured to support the substrate. The gas supplying unit is configured to inject an oxygen content control gas to control a content of oxygen in the chamber during the dehydrogenation process to a predetermined content. The gas exhausting unit is configured to exhaust oxygen in the chamber and the oxygen content control gas together. The dehydrogenating apparatus for manufacturing a thin film transistor according to an exemplary embodiment of the present disclosure incudes a gas supplying unit configured to inject an oxygen content control gas and a gas exhausting unit configured to exhaust oxygen in the chamber and the oxygen content control gas together. Therefore, the content of oxygen in the chamber for a dehydrogenation process is reduced to a predetermined content. Accordingly, adsorption of oxygen and hetero elements onto the surface of the amorphous silicon layer during the dehydrogenation process may be minimized and the surface roughness of the polysilicon layer formed by crystallization of the amorphous silicon layer may be improved.

According to still another aspect of the present disclosure, there is provided an organic light emitting display device. The organic light emitting display device includes a polysilicon layer on a substrate, a gate insulating layer which covers the polysilicon layer, a gate electrode which overlaps the polysilicon layer on the gate insulating layer, an interlayer insulating layer which covers the gate insulating layer and the gate electrode, a source electrode and a drain electrode which are connected to the polysilicon layer on the interlayer insulating layer, a planarizing layer which covers the source electrode and the drain electrode, and a thin film transistor which includes an organic light emitting diode (OLED) connected to the source electrode or the drain electrode on the planarizing layer. A surface roughness value (Rq) of the polysilicon layer is 10 nm or less and the surface roughness value (Rq) of the polysilicon layer is defined by a root mean square (rms) value of height values of a curved surface of the polysilicon layer which is measured with respect to the reference plane. The organic light emitting display device according to an exemplary embodiment of the present disclosure includes a thin film transistor including a polysilicon layer which has a low surface roughness value (Rq), substantially uniform polysilicon grains, and slight defect and thus has an enhanced display quality. All the plurality of thin film transistors formed by a polysilicon layer having an enhanced film characteristic has an enhanced device characteristic, so that a precise driving current is supplied to the organic light emitting diode connected to the thin film transistor and organic light emitting diodes emit light at the same gray level. Accordingly, a striped stain caused due to degraded film characteristic of the polysilicon layer may be significantly reduced.

Embodiments also relate to a method of manufacturing a polysilicon layer. At least a portion of oxygen is reduced in a chamber to change an amount of oxygen in the chamber from a first value to a second value of 100 ppm or lower. A substrate on which an amorphous silicon layer is formed is inserted into the chamber. A dehydrogenation process is performed in the chamber for the amorphous silicon layer. The amorphous silicon layer is crystallized to form the polysilicon layer.

Embodiments also relate to an electroluminescence (EL) display device. The EL device includes a substrate, a thin film transistor (TFT) on the substrate, and an EL device coupled to the TFT. The TFT includes a polysilicon active layer. A surface roughness of the polysilicon active layer is 10 nm or lower, where the surface roughness of the polysilicon active layer is defined as the root mean square (RMS) of deviations of surfaces of the polysilicon active layer from a reference plane.

Embodiments also relate to a method of forming a TFT including a gate electrode, a polysilicon layer, a gate insulation layer, a source electrode, and a drain electrode. For forming the polysilicon layer, an amorphous silicon layer is formed on a substrate. An oxygen content control gas is injected into a chamber. A portion of oxygen is exhausted from the chamber together with at least a portion of the injected oxygen content control gas. The substrate with the amorphous silicon layer is inserted into the chamber. A dehydrogenation process is performed in the chamber for the amorphous silicon layer. The amorphous silicon layer is crystallized to form the polysilicon layer.

Other detailed matters of the exemplary embodiments are included in the detailed description and the drawings.

According to the present disclosure, it is possible to minimize adsorption of oxygen and hetero elements onto the surface of the amorphous silicon layer, reduce a surface roughness of the polysilicon layer formed from the amorphous silicon layer, and uniformly form silicon crystal grains of the polysilicon layer.

Further, it is possible to improve the device characteristic of the thin film transistor, provide precise driving current to the organic light emitting diode connected to the thin film transistor, and significantly reduce a striped stain caused by the degraded film characteristic of the polysilicon layer.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION OF THE PREFERRED EMBODIMENTS

Figure 1:
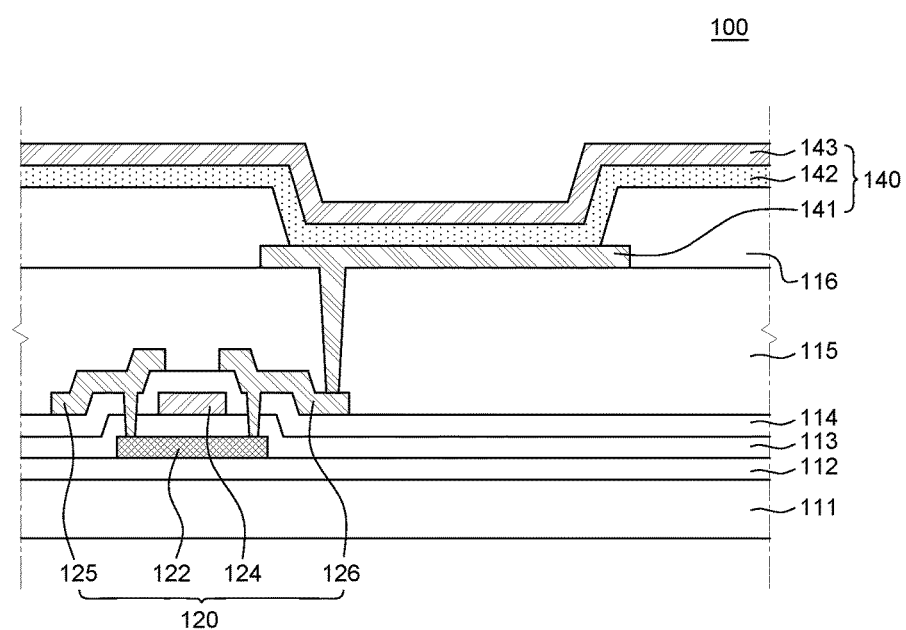
FIG. 1 is a schematic plan view illustrating an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to exemplary embodiment disclosed herein but will be implemented in various forms. The exemplary embodiments are provided by way of example so that a person of ordinary skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," and "having" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is used.

When an element or layer is disposed "on" other element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely coupled to or combined with each other and can be interlocked and operated in technically various ways, and the embodiments can be carried out independently of or in association with each other.

Hereinafter, various exemplary embodiments of the present disclosure will be described in detail with reference to accompanying drawings.

FIG. 1 is a schematic plan view illustrating an organic light emitting display device according to an exemplary embodiment of the present disclosure. An organic light emitting display device 100 according to an exemplary embodiment of the present disclosure includes a substrate 111, a thin film transistor 120, and an organic light emitting diode 140. Even though one thin film transistor 120 and one organic light emitting diode 140 are illustrated in FIG. 1, the organic light emitting display device 100 according to the exemplary embodiment of the present disclosure includes a plurality of thin film transistors 120 disposed on the substrate 111 in a matrix and a plurality of organic light emitting diodes 140. The organic light emitting diodes 140 configure one sub pixel and adjacent sub pixels form a group to be configured as a pixel.

The substrate 111 supports and protects several components of the organic light emitting display device 100. The substrate 111 may be formed of an insulating material, for example, may be formed of glass or a plastic material.

The thin film transistor 120 is disposed on a buffer layer 112 on the substrate 111. The buffer layer 112 may suppress moisture or impurities from permeating through the substrate 111 and planarize an upper portion of the substrate 111. However, the buffer layer 112 is not an essential component and whether to form the buffer layer 112 is determined depending on a type of substrate 111 or a type of thin film transistor (TFT).

The thin film transistor 120 is disposed on the buffer layer 112 and supplies a signal to the organic light emitting diode 140. The thin film transistor 120 includes a polysilicon layer 122, a gate electrode 124, a source electrode 125, and a drain electrode 126. Specifically, the polysilicon layer 122 is formed on the buffer layer 112 and the gate insulating layer 113 which covers the polysilicon layer 122 and insulates the gate electrode 124 from the polysilicon layer 122 is formed on the polysilicon layer 122. Further, the gate electrode 124 is formed on the gate insulating layer 113 to overlap the polysilicon layer 122 and an interlayer insulating layer 114 is formed to cover the gate electrode 124 and the gate insulating layer 113. The source electrode 125 and the drain electrode 126 which are connected to the polysilicon layer 122 are formed on the interlayer insulating layer 114.

The polysilicon layer 122 is formed of low temperature polycrystalline silicon (LTPS). The polysilicon layer 122 is formed by crystallizing an amorphous silicon layer using a high energy laser after forming the amorphous silicon layer on the buffer layer 112. Detailed description thereof will be provided with reference to FIGS. 2 to 3D.

The polysilicon layer 122 has a flat top surface. Specifically, the polysilicon layer 122 has a low surface roughness and for example, has a surface roughness of 10 nm or lower. Here, the surface roughness is a physical quantity representing a degree of roughness of a specific surface. In one embodiment, the surface roughness value ($R_q$) is defined as a root mean square (RMS) value of deviation values of curved surfaces of an actual polysilicon layer 122 with respect to an ideally flat reference plane. When the surface of the polysilicon layer 122 is ideally flat, the reference plane refers to the same plane as the surface and becomes a referential point for measuring a height. Specifically, the surface roughness value ($R_q$) is defined by the following Equation 1.

$$R_q = \sqrt{\frac{1}{l}\int_0^l z^2(x)dx}.$$ [Equation 1]

Here, $R_q$ is a surface roughness value, l means a measurement area where the height of the surface is measured, and z(x) means a height value at a point which is spaced apart from a referential point for measuring the height of the surface by x on the plane.

Therefore, when the polysilicon layer 122 has a surface roughness valued ($R_q$) of 10 nm or less, it means that the RMS value of the surface height values of the polysilicon layer 122 measured with reference to the reference plane is 10 nm or less. That is, the surface roughness value ($R_q$) indicates flatness of the surface and the lower the surface roughness value ($R_q$) value, the flatter the surface. The organic light emitting display device according to the exemplary embodiment of the present disclosure includes the thin film transistor 120 equipped with the polysilicon layer 122 having an enhanced surface roughness value ($R_q$) of 10 nm or less. The polysilicon layer can have a uniform thickness by improving the roughness of the surface where the polysilicon layer is formed. Therefore, the thin film transistor 120 may transmit a precise driving current corresponding to a data voltage to the organic light emitting diode 140 and the organic light emitting diode 140 may emit light at a gray level corresponding to the data voltage. Detailed description thereof will be provided with reference to FIGS. 4A to 4C.

Further, the polysilicon layer 122 has a silicon crystal grain which is uniformly grown and the silicon crystal grain has slight defects. In other words, the polysilicon layer 122 has an enhanced film characteristic. Specifically, the polysilicon layer 122 may include substantially uniform silicon crystal grains having a size of 0.13 μm to 0.75 μm and the silicon crystal grains may be uniformly disposed. Detailed description thereof will be provided with reference to FIGS. 6A to 7B.

In FIG. 1, for the convenience of description, among various thin film transistors 120 which may be included in the organic light emitting display device 100, a driving thin film transistor 120 which is connected to the organic light emitting diode 140 is illustrated. However, the organic light emitting display device 100 may further include a switching thin film transistor or a capacitor which drives the organic light emitting diode 140. Further, even though in the present disclosure, it is described that the thin film transistor 120 has a coplanar structure, an inverted staggered thin film transistor 120 may also be used.

A planarizing layer 115 which covers the source electrode 125 and the drain electrode 126 is disposed on the thin film transistor 120. The planarizing layer 115 is a layer which planarizes an upper portion of the substrate 111 and may be formed of an organic insulating layer to cover a step portion of the upper portion of the substrate 111. The planarizing layer 115 includes a contact hole which electrically connects the thin film transistor 120 to the anode 141 of the organic light emitting diode 140.

The organic light emitting diode 140 is disposed on the planarizing layer 115 and includes an anode 141, an organic layer 142, and a cathode 143.

The anode 141 is an electrode which supplies holes to the organic layer 142 and may be configured by a transparent conductive material having a high work function. The transparent conductive material may include ITO, IZO, or ITZO, but is not limited thereto. Here, the anode 141 may also be referred to as a pixel electrode.

The cathode 143 is an electrode which supplies electrons to the organic layer 142. The cathode 143 may be configured by a metal having a relatively low work function, for example, silver, titanium (Ti), aluminum, molybdenum (Mo), and an alloy (Ag:Mg) of silver and magnesium. Here, the cathode 143 may also be referred to as a common electrode.

The organic layer 142 is disposed between the anode 141 and the cathode 143. The organic layer 142 includes an organic light emitting layer. As illustrated in FIG. 1, the organic layer 142 may be commonly formed for all sub pixels on the substrate 111. In this case, the organic light emitting layer of the organic layer 142 may be formed of a material which emits white light and a color filter may be disposed to correspond to an area where the organic light emitting layer emits light.

In addition to the organic light emitting layer, the organic layer 142 may further includes an injecting layer or a transporting layer which improve an emission efficiency of the organic light emitting diode 140. For example, in addition to the organic light emitting layer, a hole injecting layer or a hole transporting layer is further disposed between the anode 141 and the cathode 143 to smoothly move the holes. The hole injecting layer or the hole transporting layer may have a common structure to be commonly disposed in the plurality of sub pixels.

A bank layer 116 may define a sub pixel and exposes a part of a top surface of the anode 141. Specifically, the bank layer 116 may be disposed to cover an edge of the anode 141. The bank layer 116 is formed of an insulating material which insulates anodes 141 of the adjacent sub pixels from each other.

Figure 2:
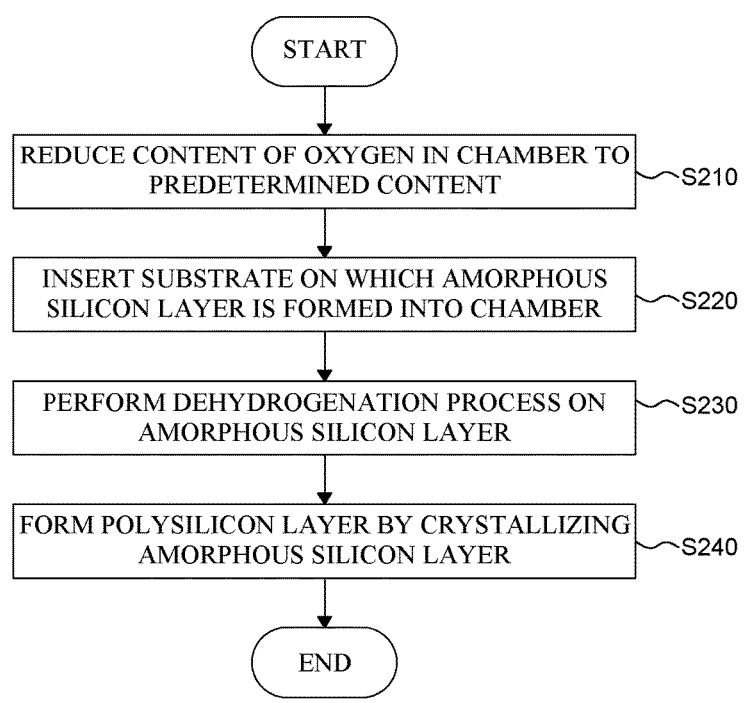
FIG. 2 is a flowchart explaining a method of manufacturing a thin film transistor according to an exemplary embodiment of the present disclosure.

FIG. 2 is a flowchart explaining a method of manufacturing a thin film transistor according to an exemplary embodiment of the present disclosure. FIGS. 3A to 3D are cross-sectional views explaining a method of manufacturing a thin film transistor according to an exemplary embodiment of the present disclosure. The method of manufacturing a thin film transistor according to an exemplary embodiment of the present disclosure is characterized by a method of forming a polysilicon layer 122 of a thin film transistor. Therefore, in FIGS. 2 to 3D, the method of forming a polysilicon layer 122 is illustrated, but the remaining of the method of manufacturing a thin film transistor is not illustrated. For the convenience of description, when FIGS. 2 to 3D are described, FIG. 1 may also be referred to.

First, the buffer layer 112 is formed on the substrate 111. The buffer layer 112 may be formed of silicon oxide (SiOx) and/or silicon nitride SiNx and may be formed on the substrate by a chemical vapor deposition (CVD) method or a PECVD method.

The amorphous semiconductor layer 121 is formed on the buffer layer 112. The amorphous silicon layer 121 may be deposited by the PECVD method using silane ($SiH_4$) as a source gas. The PECVD method has a low deposition temperature of 400° C. and a high deposition speed, so that it is advantageous in that a cost and a time for the manufacturing process of the thin film transistor 120 are saved.

The amorphous silicon layer 121 formed on the buffer layer 112 is formed to be a polysilicon layer 122 through a dehydrogenation process and a laser annealing process. This will be described in detail with reference to FIGS. 2 to 3D.

Figure 3A:
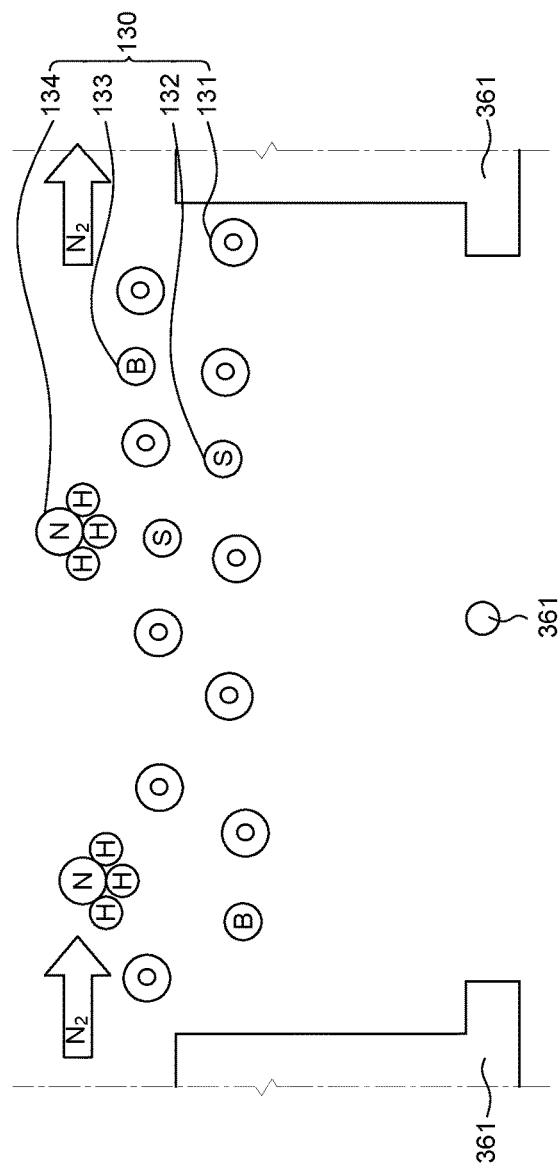
FIGS. 3A to 3D are cross-sectional views explaining a method of manufacturing a thin film transistor according to an exemplary embodiment of the present disclosure.

Referring to FIGS. 2 and 3A, in the method of manufacturing a thin film transistor according to the exemplary embodiment of the present disclosure, a content of oxygen 131 in the chamber for performing the dehydrogenation process of the amorphous silicon layer 121 is reduced to a predetermined content (S210). A content of oxygen 131 in the chamber may refer to an amount of oxygen gas (e.g., in units of moles, g) and/or a concentration of oxygen gas (e.g., in units of moles/volume, ppm). For example, an amount of oxygen in the chamber may be reduced from a first value to a second value smaller than the first value.

As illustrated in FIG. 3A, there may be various hetero elements 130 in the chamber for performing the dehydrogenation process. For example, in the chamber for performing the dehydrogenation process, various hetero elements 130 such as oxygen 131, sulfur 132, boron 133, and ammonia 134 may be present. The hetero elements 130 do not react with the amorphous silicon layer 121, but may be adsorbed onto a surface of the amorphous silicon layer 121. Various hetero elements 130 are present in the chamber and a content of oxygen 131 may be particularly high. Specifically, 200,000 ppm or higher of oxygen 131 may be contained in the chamber. Oxygen 131 may be adsorbed onto the surface of the amorphous silicon layer 121 to interrupt crystallization of the amorphous silicon layer 121, so that it is necessary to reduce the content of oxygen 131 in the chamber to a predetermined content before inputting the substrate 111 in the chamber.

Specifically, the content of oxygen 131 in the chamber may be reduced to a value below a threshold. In one embodiment, the content of oxygen 131 is reduced to 100 ppm or less. In order to reduce the content of oxygen 131 in the chamber to 100 ppm or less, an oxygen content control gas may be injected. The oxygen content control gas is a gas having a low reactivity and may use a gas which is formed of an element which is hardly adsorbed onto the surface of the amorphous silicon layer 121. For example, as illustrated in FIG. 3A, a nitrogen gas $N_2$ may be used as the oxygen content control gas. However, the oxygen content control gas is not limited to the nitrogen gas ($N_2$), but inert gas which has a low reactivity and is hardly adsorbed onto the surface of the amorphous silicon layer 121 may be used as the oxygen content control gas. For example, argon gas Ar may also be used as the oxygen content control gas.

The nitrogen gas ($N_2$) is injected through a gas supplying unit disposed on one side of the chamber and is discharged through a gas exhausting unit disposed on the other side of the chamber. The hetero elements 130 including the oxygen 131 in the chamber are discharged to the gas exhausting unit in accordance with floating of the nitrogen gas ($N_2$) so that the content of oxygen 131 in the chamber may be reduced. Thus, oxygen content in the chamber may be reduced by injecting the oxygen content control gas into the chamber and exhausting at least a portion of the injected oxygen content control gas from the chamber together with at least a portion of oxygen in the chamber.

Nitrogen gas $N_2$ is consistently supplied at an appropriate flow rate to sufficiently purge oxygen 131 in the chamber. The oxygen content control gas may be injected at a first flow rate before the hydrogenation process. For example, Nitrogen gas $N_2$ may be consistently supplied at a flow rate of 150 slm (standard liter per minute) for 10 minutes or more.

As described above, the oxygen content in the chamber may be reduced before inserting the substrate 111. Therefore, the substrate 111 is not disposed on a substrate support 361 in FIG. 3A. The substrate support 361 is configured to support the substrate 111 below the substrate 111 during the dehydrogenation process.

In some exemplary embodiments, the atmosphere in the chamber is formed to be vacuous so that the content of oxygen 131 may be reduced. In this case, a pressure in the chamber is reduced to be an atmospheric pressure (1 atm) or less and the atmosphere in the chamber becomes vacuous, so that the content of oxygen 131 is reduced.

Figure 3B:
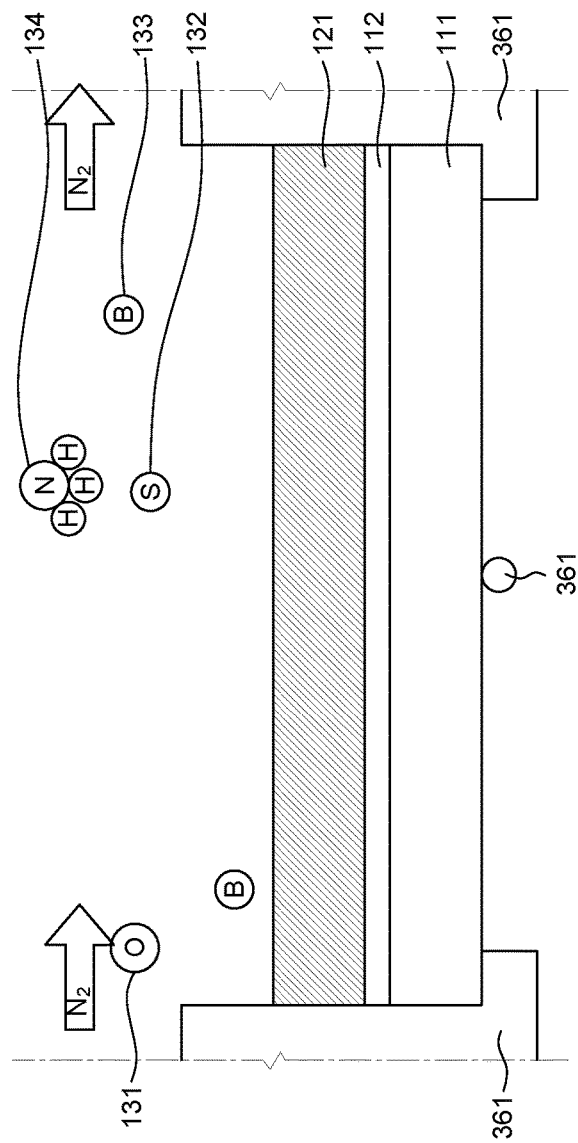

Referring to FIGS. 2 and 3B, the substrate 111 on which the amorphous silicon layer 121 is formed is inputted into the chamber (S220).

The substrate 111 is inputted through a substrate insertion slot of the chamber and is located on the substrate support 361 in the chamber. Even though one substrate 111 is located on the substrate support 361 in FIG. 3B, a plurality of substrates 111 may be inputted into the chamber in a batch type. In this case, a plurality of substrate supports 361 may be disposed in the chamber.

When the substrate 111 is inputted into the chamber, the content of oxygen 131 in the chamber is continuously maintained to be 100 ppm or less. To this end, the oxygen content control gas may consistently flow therein. For example, the nitrogen gas ($N_2$) may consistently flow therein through a gas inlet. In this case, the nitrogen gas ($N_2$) flows to float above the amorphous silicon layer 121 as illustrated in FIG. 3B so that the nitrogen gas ($N_2$) injected through the gas inlet does not affect the surface of the amorphous silicon layer 121.

The nitrogen gas ($N_2$) flows therein at an appropriate flow rate so as not to affect the surface of the amorphous silicon layer 121 while maintaining the content of oxygen to be 100 ppm or lower. The oxygen content control gas may be injected after the substrate 111 is inputted in the chamber at a second flow rate smaller than the first flow rate. For example, the nitrogen gas ($N_2$) may flow at a flow rate of 10 slm.

Since the content of oxygen 131 in the chamber is 100 ppm or less, oxygen 131 may be hardly adsorbed onto the surface of the amorphous silicon layer 121. Therefore, during the subsequent dehydrogenation process, the amorphous silicon layer 121 may be uniformly crystallized.

Figure 3C:
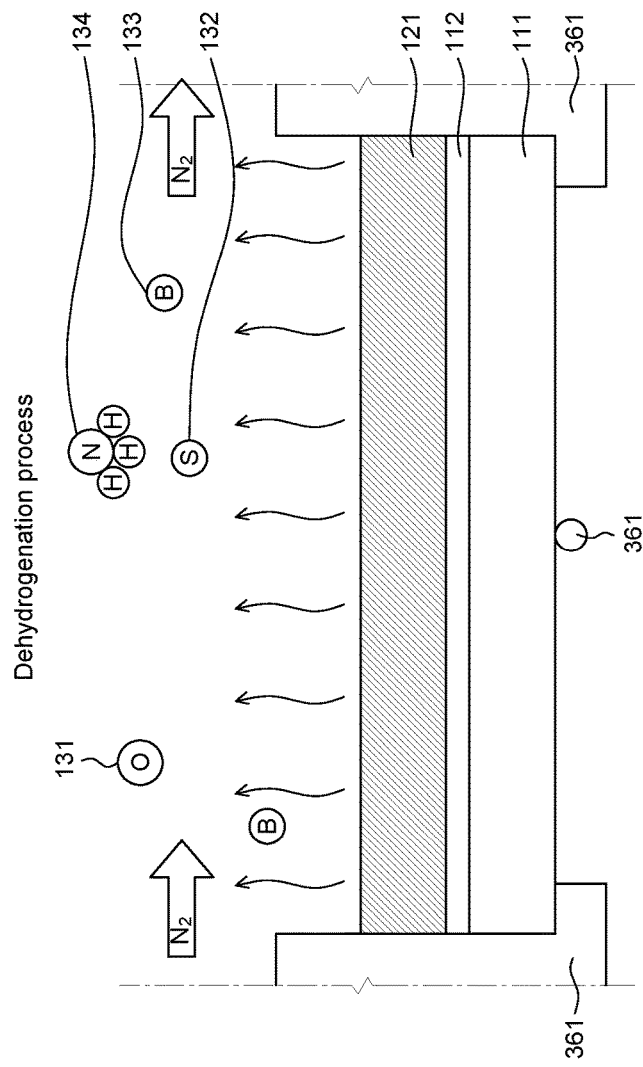
Figure 3D:
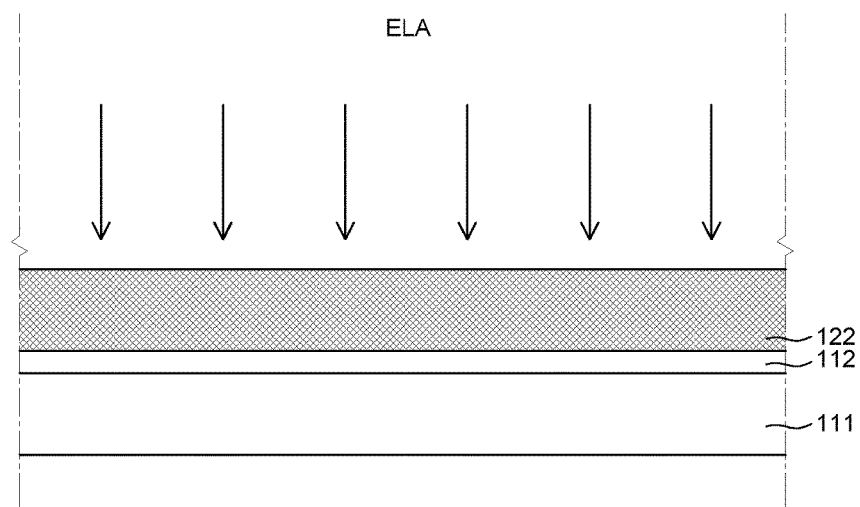

Referring to FIGS. 2 and 3C, the chamber is heated to perform the dehydrogenation process on the amorphous silicon layer 121 (S230).

As described above, the amorphous silicon layer 121 may be formed by the PECVD method and in the PECVD method, silane is used as a source gas. Therefore, a large amount of hydrogen may be included in the amorphous silicon layer 121. For example, hydrogen may be contained in the amorphous silicon layer 121 at a ratio of 13% or higher as compared with a content of amorphous silicon. When the amorphous silicon 121 is crystallized without removing hydrogen in the amorphous silicon layer 121, hydrogen may cause the surface of the polysilicon layer 122 to be rough.

Specifically, a high energy laser may be irradiated onto the amorphous silicon layer 121 to crystallize the amorphous silicon layer 121. Hydrogen has a high vapor pressure, so that the hydrogen may quickly evaporate. When the laser is irradiated onto the amorphous silicon layer 121 so that the amorphous silicon layer is melted, the hydrogen may evaporate through the surface of the melted amorphous silicon layer 121. When the hydrogen penetrates the surface of the melted amorphous silicon layer 121, the surface of the amorphous silicon layer 121 may become uneven. Further, the melted amorphous silicon layer is crystallized so that the uneven surface may be hardened as it is. In this case, the polysilicon layer 122 has an uneven surface and the surface roughness of the polysilicon layer 122 may be increased. The uneven surface of the polysilicon layer 122 interrupts movement of charges, so that the thin film transistor 120 including the polysilicon layer 122 having a high surface roughness may have a degraded device characteristic.

In order to prevent the above-described problem, hydrogen in the amorphous silicon layer 121 may be removed before irradiating a laser onto the amorphous silicon layer 121. To this end, the chamber may be heated at a predetermined temperature. For example, the chamber may be heated at a temperature of 400° C. to 500° C. In this case, hydrogen in the amorphous silicon layer 121 evaporates by breaking a silicon-hydrogen bond in the amorphous silicon layer 121 at a high temperature environment and a content of hydrogen in the amorphous silicon layer 121 may be reduced.

The dehydrogenation process may be performed until the content of hydrogen in the amorphous silicon layer 121 is sufficiently reduced. For example, the dehydrogenation process may be performed to reduce the content of hydrogen in the amorphous silicon layer 121 to 1% or less as compared with amorphous silicon before performing the dehydrogenation process. To this end, the chamber may be heated at a temperature of 400° C. to 500° C. for approximately 15 minutes.

In the meantime, the content of oxygen 131 in the chamber may be maintained to be 100 ppm or less during at least a part of the dehydrogenation process, or throughout the entire dehydrogenation process. To this end, the oxygen content control gas may consistently flow in the chamber. The oxygen content control gas may be injected during the dehydrogenation process in the chamber at a third flow rate smaller than the first flow rate. For example, the oxygen content control gas may consistently flow thereon at a flow rate of 10 slm during the dehydrogenation process.

Since the content of oxygen 131 in the chamber is 100 ppm or less, a small amount of oxygen 131 is present in the chamber and the number of oxygen 131 which is adsorbed onto the surface of the amorphous silicon layer 121 may be correspondingly reduced during the dehydrogenation process. Therefore, the increase of the surface roughness value (Rq) of the polysilicon layer 122 due to the adsorption of oxygen 131 may be sufficiently reduced. In order to completely suppress the adsorption of oxygen, an environment where no oxygen 131 is present in the chamber needs to be ideally provided. However, it is difficult to actually provide such an environment and it may increase the processing cost and time. However, in the method of manufacturing a thin film transistor according to the exemplary embodiment of the present disclosure, the oxygen content control gas is sprayed for 10 minutes to reduce the content of oxygen 131 to 100 ppm or less and then the dehydrogenation process is performed. Therefore, the oxygen 131 which is adsorbed onto the amorphous silicon layer 121 is sufficiently reduced until the dehydrogenation process ends from the beginning of the dehydrogenation process and the increase of the processing cost and time may be minimized.

Referring to FIGS. 2 and 3D, the amorphous silicon layer 121 is crystallized using a laser, to form the polysilicon layer 122 (S240).

A laser annealing process for forming the polysilicon layer 122 may be performed in a separate annealing chamber which is different from a chamber for performing the dehydrogenation process.

The laser annealing process may be performed using a high energy laser. For example, the amorphous silicon layer 121 may be crystallized using an excimer laser. Specifically, the excimer laser is irradiated onto the amorphous silicon layer 121 in the form of lines with a constant interval and the amorphous silicon layer 121 may be melted by energy of the laser. A nucleation site may be formed in the melted amorphous silicon layer 121 and the silicon is crystallized with respect to the nucleation site to form crystal grains of polysilicon. By the laser annealing process, the polysilicon layer 122 is formed.

Thereafter, the polysilicon layer 122 may be patterned. For example, the polysilicon layer 122 may be patterned by a photolithograph process and the thin film transistor 120 is formed in a region where the patterned polysilicon layer 122 is disposed.

In the meantime, the gate insulating layer 112 is formed to cover the patterned polysilicon layer 122 and the gate electrode 124 is formed to overlap the polysilicon layer 122. Further, impurities are doped on the polysilicon layer 122 using the gate electrode 124 as a mask and the interlayer insulating layer 113 is formed to cover the gate electrode 124 and the gate insulating layer 112. Thereafter, a hole is formed in the interlayer insulating layer 113 and the gate insulating layer 112 to expose the polysilicon layer 122 through the interlayer insulating layer 113 and the gate insulating layer 112 and the source electrode 125 and the drain electrode 126 which are in contact with the polysilicon layer 122 through a hole are formed. The gate insulating layer 112, the gate electrode 124, the interlayer insulating layer 113, the source electrode 125, and the drain electrode 126 may be formed by a known method.

A feature in that the content of oxygen in the chamber for performing the dehydrogenation process is controlled to a predetermined content to improve the film characteristic of the polysilicon layer 122 has been described in the present disclosure. However, the oxygen content control gas may be configured not only to control the content of oxygen in the chamber but also to purge hetero elements 130 in the chamber.

The method of manufacturing a thin film transistor according to an exemplary embodiment of the present disclosure controls the atmosphere in the chamber for the dehydrogenation process before performing the dehydrogenation process on the amorphous silicon layer 121. Specifically, according to the method of manufacturing a thin film transistor according to an exemplary embodiment of the present disclosure, the content of oxygen 131 in the chamber is reduced to a predetermined content. In order to adjust the content of oxygen 131 in the chamber, the oxygen content adjusting gas flow into the chamber or a pressure in the chamber is lowered to 1 atm or less to form the status in the chamber to be a vacuous state. The content of oxygen 131 in the chamber may be reduced to 100 ppm or less. During the dehydrogenation process, the content of oxygen 131 in the chamber may be maintained to be 100 ppm or less. In this case, adsorption of the oxygen 131 onto the surface of the amorphous silicon layer 121 during the dehydrogenation process may be minimized and the polysilicon layer 122 formed by the laser annealing process may have low surface roughness value (Rq) and have polysilicon grains which are grown with a substantially uniform size. In contrast, when the dehydrogenation process is performed in a chamber where the content of oxygen 131 is not controlled, a large quantity of oxygen 131 may be adopted onto the surface of the amorphous silicon layer 121 during the dehydrogenation process. Therefore, the surface roughness value (Rq) of the polysilicon layer 122 is increased, the silicon crystal grains have non-uniform sizes and defect may be generated in the silicon crystal grains. Detailed description thereof will be provided with reference to FIGS. 4A to 4C.

Figure 4A:
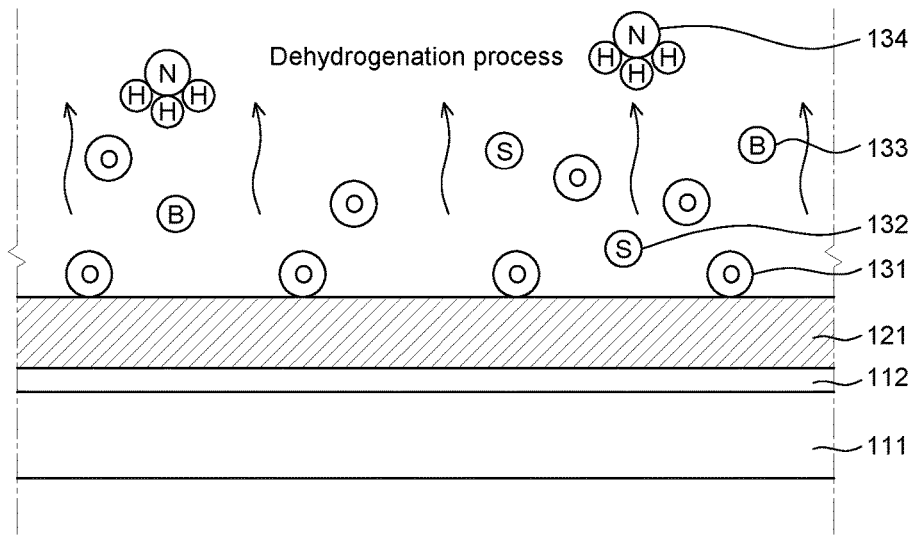
FIGS. 4A to 4C are cross-sectional views explaining a comparative method of manufacturing a thin film transistor.
Figure 4B:
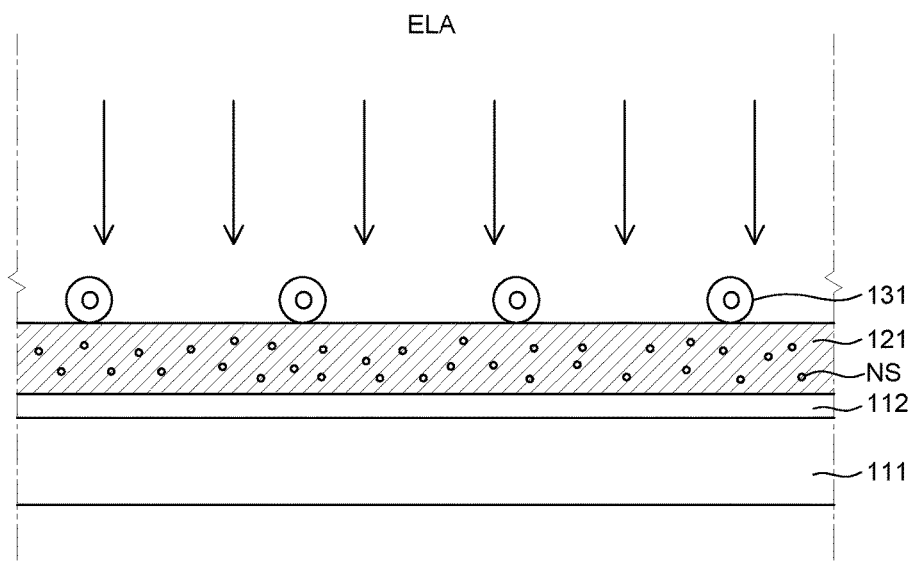
Figure 4C:
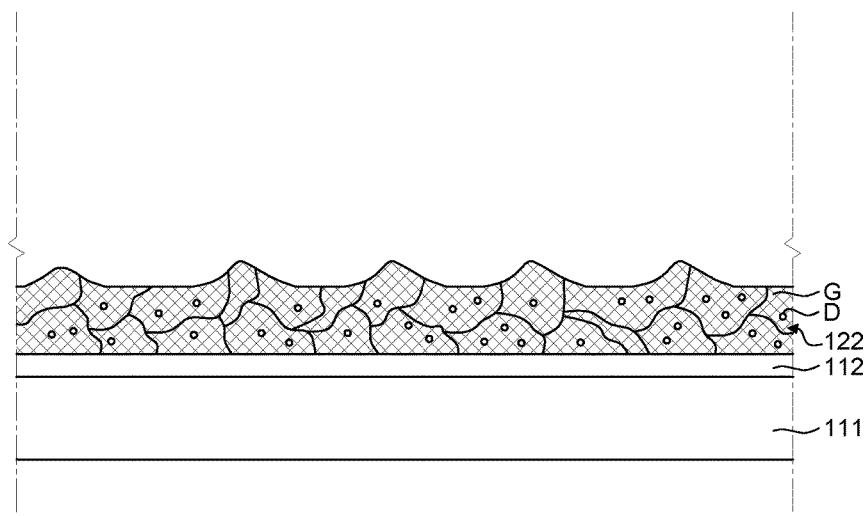

FIGS. 4A to 4C are cross-sectional views explaining a method of manufacturing a thin film transistor.

Referring to FIGS. 4A to 4C, when the content of oxygen 131 is not controlled during the dehydrogenation process, the polysilicon layer 122 may have a high surface roughness and also have silicon crystal grains with non-uniform sizes and arrangements.

Specifically, as illustrated in FIG. 4A, in the chamber where the content of oxygen 131 is not controlled, 200,000 ppm or higher of oxygen may be contained. When the dehydrogenation process is performed in the chamber where a large amount of oxygen 131 is contained, oxygen 131 actively moves under a high temperature chamber atmosphere to be easily adsorbed onto the surface of the amorphous silicon layer 121.

After completing the dehydrogenation process, as illustrated in FIG. 4B, a laser may be irradiated onto the amorphous silicon layer 121 onto which oxygen 131 has been adsorbed. In this case, the oxygen 131 adsorbed onto the surface of the amorphous silicon layer 121 may partially absorb an energy of the laser or scatter the laser during the laser annealing process. In this case, due to the oxygen 131, the laser energy may not be properly transferred to the amorphous silicon layer 121 and the amorphous silicon layer 121 may not be uniformly melted. Therefore, the nucleation site NS in the melted amorphous silicon layer 121 may be non-uniformly formed.

Silicon in the amorphous silicon layer 121 is crystallized with respect to the nucleation site which is non-uniformly formed to form silicon crystal grains. Therefore, as illustrated in FIG. 4C, the silicon crystal grains may be formed to have non-uniform sizes. Further, the silicon is crystallized with respect to the nucleation site which is non-uniformly formed, so that arrangement of the silicon crystal grains may be non-uniform and various defects may be generated in the silicon crystal grains.

In the meantime, the oxygen 131 adsorbed onto the surface of the amorphous silicon layer 121 absorbs the energy of the laser during the laser annealing process, so that a melting degree of the amorphous silicon layer in a portion where the oxygen 131 is adsorbed may be different from a melting degree of the amorphous silicon layer in a portion where the oxygen 131 is not adsorbed. A phase of the amorphous silicon which is melted to a liquid phase is transformed to a solid phase and volume thereof may expand. Further, a degree of volume expansion of the amorphous silicon in a portion where the oxygen 131 is adsorbed may be different from a degree of volume expansion of the amorphous silicon in a portion where the oxygen 131 is not adsorbed. Due to the difference of expansion, as illustrated in FIG. 4C, the polysilicon layer 122 may have uneven surface and include silicon crystal grains G with non-uniform sizes, non-uniform arrangement, and defects D. Therefore, the film characteristic of the polysilicon layer 122 may be degraded.

The movement of charges of the polysilicon layer 122 may be interrupted due to the above-described degraded film characteristic of the polysilicon layer 122 and an amount of current flowing through the polysilicon layer 122 may be reduced. Accordingly, the thin film transistor 120 including a polysilicon layer 122 with a degraded film characteristic may not smoothly transfer the charges as compared with the thin film transistor 120 including a polysilicon layer 122 with an enhanced film characteristic. Further, a device characteristic thereof may be degraded.

Further, a laser is irradiated in the form of lines with a constant interval during the laser annealing process, so that a striped curve may be formed on the surface of the polysilicon layer 122 along the line to which the laser is irradiated. Specifically, when the laser is irradiated in a region where the oxygen 131 is adsorbed in the form of lines, there may be a problem in that the oxygen 131 not only partially absorbs the laser energy but also scatters the laser. In this case, in a region where a relatively large amount of oxygen 131 is adsorbed, a large amount of laser may be scattered and the amorphous silicon on the line on which the laser is irradiated may be relatively less melted. As described above, the degree of volume expansion which is generated while the amorphous silicon is crystallized may vary depending on the melting degree of the amorphous silicon so that the surface of the polysilicon layer 122 may be formed to be curved along the line on where the laser is irradiated. The polysilicon layer 122 with a line shaped curved surface is patterned to be formed as a thin film transistor 120. Specifically, the thin film transistors 120 are formed in a matrix to configure sub pixels in the form of a matrix, so that the thin film transistor 120 on a specific line may include a polysilicon layer 122 with a degraded film characteristic. Therefore, the thin film transistors 120 on a specific line may have a degraded device characteristic as compared with thin film transistor 120 in another region. As mentioned above, the thin film transistor 120 with the degraded device characteristic may not satisfactorily transfer the current as compared with the thin film transistor 120 with a normal characteristic. Therefore, an organic light emitting diode 140 which is connected to the thin film transistor 120 with the degraded device characteristic may emit light at a lower gray level than an organic light emitting diode 140 which is connected to a thin film transistor 120 with a normal characteristic. Therefore, a striped stain may be generated in the organic light emitting display device.

However, in the method of manufacturing a thin film transistor according to the exemplary embodiment of the present disclosure, the content of oxygen 131 in the chamber is lowered to 100 ppm or lower before performing the dehydrogenation process, so that the amount of oxygen 131 which is adsorbed onto the surface of the amorphous silicon layer 121 may be reduced. Therefore, absorption of laser energy by the oxygen 131 which is adsorbed onto the surface of the amorphous silicon layer 121 during the laser annealing process may be minimized. Accordingly, the amorphous silicon layer 121 may receive substantially uniform energy and nucleation sites NS may be uniformly formed in the melted amorphous silicon layer 121. As a result, the silicon may be uniformly crystallized, the crystallized silicon crystal grains G may be grown with a substantially uniform size, and arrangement of the silicon crystal grains G may become substantially uniform. Further, the silicon is crystallized with respect to the uniformly formed nucleation sites NS, so that the number of defects D in the silicon crystal grains G may be reduced. Further, the silicon on the amorphous silicon layer 121 is melted at uniform energy so that a degree of volume expansion may be substantially uniform and the surface roughness value (Rq) of the polysilicon layer 122 may be lowered.

In the meantime, a degree to which the amount of oxygen 131 adsorbed onto the surface of the amorphous silicon layer 121 is reduced may be understood by comparing the number of silicon-oxygen bonds present in the amorphous silicon layer 121 and the number of silicon-oxygen bonds present in the polysilicon layer 122. Specifically, when the content of oxygen in the chamber for the dehydrogenation process is reduced to 100 ppm or less, the number of silicon-oxygen bonds present in the polysilicon layer 122 may be smaller than the number of silicon-oxygen bonds present in the amorphous silicon layer 121 before crystallization. For example, the number of silicon-oxygen bonds in the polysilicon layer 122 is reduced to 92% of the number of silicon-oxygen bonds present in the amorphous silicon layer 121 before crystallization. In contrast, when the content of oxygen in the chamber for the dehydrogenation process is not controlled, 200,000 ppm or more oxygen may be included in the chamber and a large amount of oxygen may be adsorbed onto the surface of the amorphous silicon layer 121. Therefore, the polysilicon layer 122 may include a larger number of silicon-oxygen bonds than the number of silicon-oxygen bonds present in the amorphous silicon layer 121 before crystallization. For example, the number of silicon-oxygen bonds present in the polysilicon layer 122 may be increased to 145% of the number of silicon-oxygen bonds present in the amorphous silicon layer 121 before crystallization. That is, it is understood that when the content of oxygen in the chamber is not controlled, the oxygen 131 is adsorbed onto the amorphous silicon layer 121 during the dehydrogenation process to increase the number of silicon-oxygen bonds in the polysilicon layer 122. In this case, the number of silicon-oxygen bonds in the amorphous silicon layer 121 and the polysilicon layer 122 may be measured by a dynamic secondary ion mass spectrometer (SIMS).

The surface roughness of the polysilicon layer 122 which is improved as the content of oxygen is controlled during the dehydrogenation process will be described with reference to FIG. 5.

Figure 5:
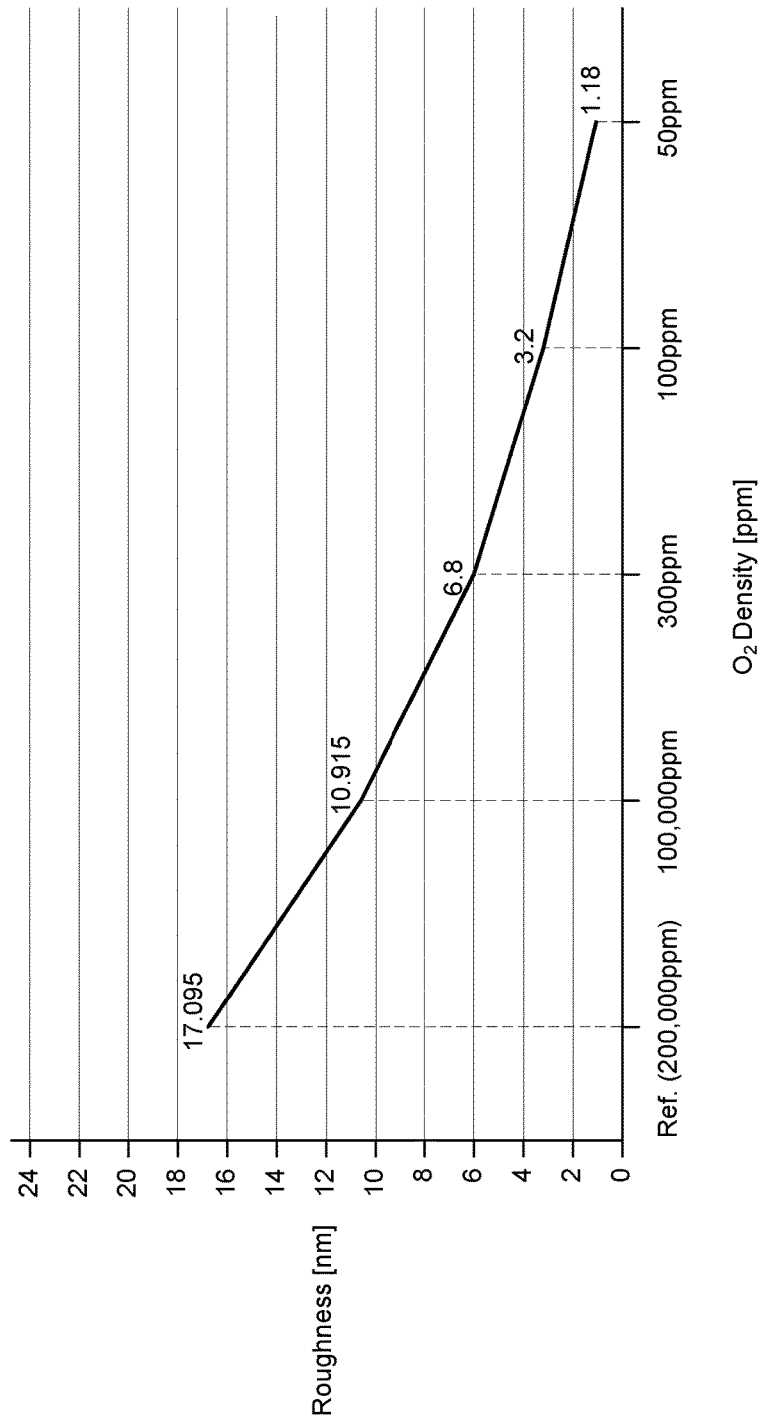
FIG. 5 is a graph explaining an improved surface roughness of a polysilicon layer included in a thin film transistor according to an exemplary embodiment of the present disclosure.

FIG. 5 is a graph explaining an improved surface roughness of a polysilicon layer included in a thin film transistor according to an exemplary embodiment of the present disclosure.

FIG. 5 is a graph illustrating a surface roughness of a polysilicon layer which varies as the content of oxygen is controlled during the dehydrogenation process. The graph of FIG. 5 is obtained by calculating the surface roughness value (Rq) of the polysilicon layer by Equation 1. Specifically, an amorphous silicon layer with a thickness of 500 Å is formed on a substrate with a width of 730 nm and a length of 920 nm and the dehydrogenation process is performed on the amorphous silicon layer in a chamber in which various contents of oxygen is contained, at 430° C. for 15 minutes and the amorphous silicon layer is crystallized using excimer laser. Therefore, after forming the polysilicon layer, the surface roughness value (Rq) of the polysilicon layer is measured.

Referring to FIG. 5, it is understood that the surface roughness value (Rq) of the polysilicon layer varies depending on the content of oxygen in the chamber for performing the dehydrogenation process. When the content of oxygen in the chamber is not controlled, 200,000 ppm or higher of oxygen is present in the chamber and the dehydrogenation process is performed in the chamber so that the formed polysilicon layer has a surface roughness value (Rq) of 17.095 nm. In contrast, the polysilicon layer which is formed by performing the dehydrogenation process after reducing the content of oxygen in the chamber to 100 ppm or less has a surface roughness value (Rq) of 3.2 nm. That is, when the content of oxygen in the chamber for performing the dehydrogenation process is reduced to 100 ppm or less, the amount of oxygen which is adsorbed onto the surface of the amorphous silicon layer is significantly reduced. Therefore, absorption of laser energy and scattering of laser due to the adsorbed oxygen may be minimized and the amorphous silicon layer may be uniformly crystallized. As a result, the surface roughness value ($R_q$) of the polysilicon layer may be reduced. The surface roughness of the polysilicon layer which is improved by controlling the atmosphere of the dehydrogenation process is controlled may be more clearly identified by referring to atomic-force microscopy (AFM) image of FIGS. 6A and 6B.

Figure 6A:
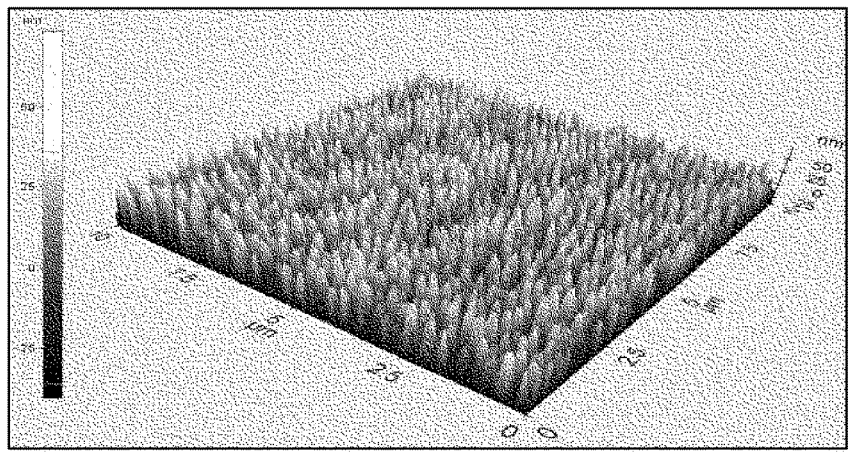
FIGS. 6A and 6B are atomic-force microscopy (AFM) images explaining an improved surface roughness of a polysilicon layer included in a thin film transistor according to an exemplary embodiment of the present disclosure.
Figure 6B:
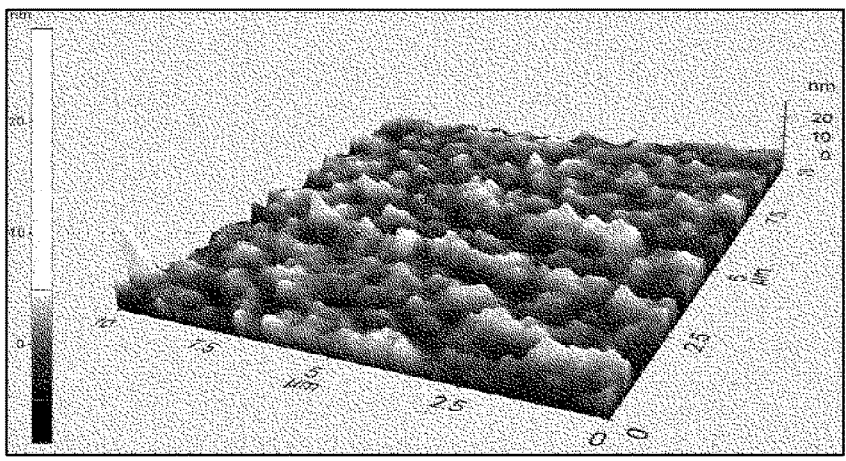

FIGS. 6A and 6B are AFM images explaining for an improved surface roughness of a polysilicon layer included in a thin film transistor according to an exemplary embodiment of the present disclosure. Specifically, the AFM image of FIG. 6A represents the surface roughness of the crystallized polysilicon layer after performing the dehydrogenation process in the chamber in which 200,000 ppm or higher of oxygen is included. The AFM image of FIG. 6B represents the surface roughness of the crystallized polysilicon layer after performing the dehydrogenation process in the chamber in which 100 ppm or less of oxygen is included. Referring to FIGS. 6A and 6B, it is understood that the surface roughness of the polysilicon layer is improved by lowering the content of oxygen in the chamber to 100 ppm or less.

Further, when the content of oxygen in the chamber for the dehydrogenation process is lowered to 100 ppm or less, the amorphous silicon is uniformly crystallized. Therefore, the sizes and the arrangement of the silicon crystal grains become substantially uniform and thus the defect in the silicon crystal grain may be significantly reduced. The above-described effect may be clearly understood from the SEM images of FIGS. 7A and 7B.

Figure 7A:
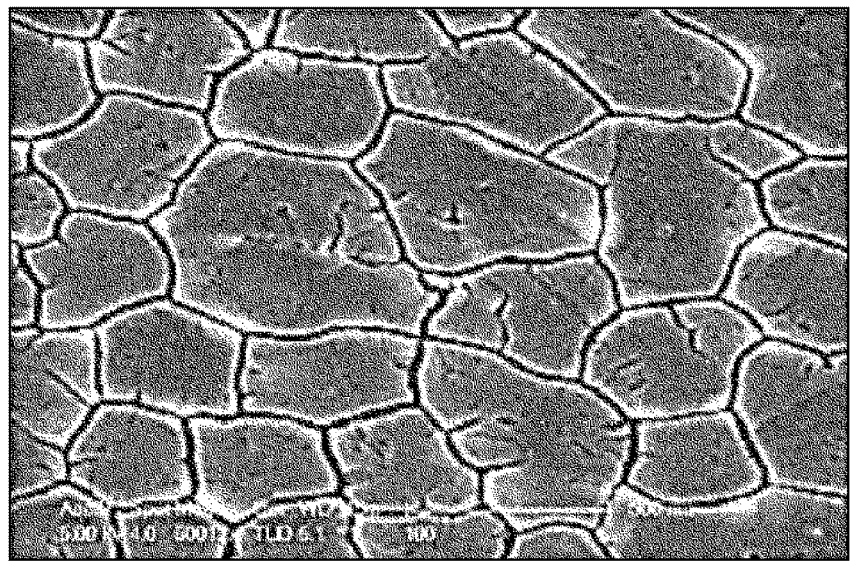
FIGS. 7A and 7B are scanning electron microscope (SEM) images explaining an improved crystallization uniformity of a polysilicon layer included in a thin film transistor according to an exemplary embodiment of the present disclosure.
Figure 7B:
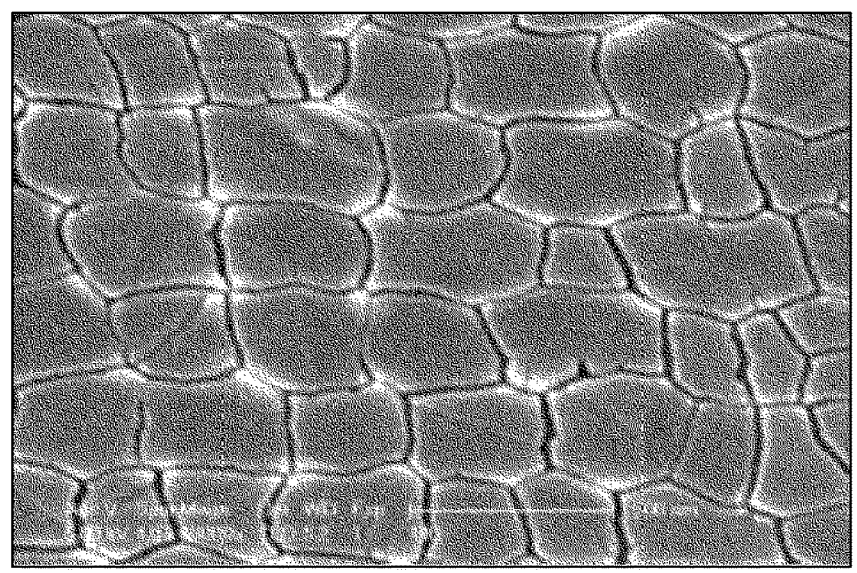

FIGS. 7A and 7B are scanning electron microscope (SEM) images explaining an improved crystallization uniformity of a polysilicon layer included in a thin film transistor according to an exemplary embodiment of the present disclosure. Specifically, the SEM image of FIG. 7A represents the silicon crystal grain of the crystallized polysilicon layer after performing the dehydrogenation process in the chamber in which 200,000 ppm or higher of oxygen is included. The SEM image of FIG. 7B represents the silicon crystal grain of the crystallized polysilicon layer after performing the dehydrogenation process in the chamber in which 100 ppm or less of oxygen is included. Referring to FIGS. 7A and 7B, it is understood that the sizes and arrangement of the silicon crystal grains of the polysilicon layer become substantially uniform by reducing the content of oxygen in the chamber to 100 ppm or less. It is further understood that the number of defects in the silicon crystal grain is reduced by reducing the content of oxygen in the chamber to 100 ppm or less.

In the meantime, as mentioned above, when the surface roughness of the polysilicon layer is 10 nm or less, the polysilicon layer may have a sufficiently enhanced film characteristic and the device characteristic of the thin film transistor may be improved. That is, as illustrated in FIG. 5, when the content of oxygen in the chamber is reduced to 300 ppm before the dehydrogenation process, the surface roughness value ($R_q$) of the polysilicon layer may be reduced to be 10 nm or less. However, after the laser annealing process on the amorphous silicon layer, in order to minimize the striped stain generated in the organic light emitting display device, it is desirable to reduce the content of oxygen in the chamber to 100 ppm.

Specifically, the oxygen adsorbed onto the surface of the amorphous silicon layer absorbs energy of the laser which is irradiated in the form of a line during the laser annealing process and scatters the laser, so that a wave-like shape is formed across the surface of the polysilicon layer. However, when the content of oxygen in the chamber for the dehydrogenation process is reduced, the number of oxygen which is adsorbed onto the surface of the amorphous silicon layer is reduced. Therefore, the absorption of laser energy and laser scattering may be significantly reduced and thus the striped curve may be minimized. The polysilicon layer in which the striped curves are minimized is patterned to form thin film transistors in the form of matrix, so that all the thin film transistors of the organic light emitting display device may have similar device characteristic. Accordingly, the thin film transistors may transfer the same driving current in response to the same data voltage and thus individual organic light emitting diodes which are connected to the thin film transistors may emit light at the same gray level. As a result, the striped stain which is generated in the organic light emitting display device may be minimized. Specifically, as represented in Table 1, the polysilicon layer manufactured by the method of manufacturing a thin film transistor according to the exemplary embodiment of the present disclosure may have striped curves reduced as compared with a polysilicon layer manufactured by a method of manufacturing a thin film transistor according to a comparative embodiment.

TABLE 1

| Classification | Number of vertical lines | Number of horizontal lines |
| --- | --- | --- |
| Comparative embodiment | 29 | 5 |
| Exemplary embodiment | 7 | 4 |

In Table 1, the polysilicon layer according to the exemplary embodiment of the present disclosure is formed by forming an amorphous silicon layer with a thickness of 500 Å on a substrate with a width of 730 nm and a length of 920 nm, performing the dehydrogenation process on the amorphous silicon layer in a chamber in which 100 ppm or less of oxygen is contained, at 430° C. for 15 minutes, and crystallizing the amorphous silicon layer using excimer laser. In contrast, the polysilicon layer according to the comparative embodiment is formed by forming an amorphous silicon layer with a thickness of 500 Å on a substrate with a width of 730 nm and a length of 920 nm, performing the dehydrogenation process on the amorphous silicon layer in a chamber in which 200,000 ppm or higher of oxygen is contained, at 430° C. for 15 minutes, and crystallizing the amorphous silicon layer using excimer laser. The stripes in Table 1 are derived by counting the number of stripes on the surface of the polysilicon layer with naked eye.

Referring to Table 1, it is understood that when the dehydrogenation process is performed in the chamber having 200,000 ppm or higher of oxygen content, the striped curves generated in the polysilicon layer include 29 vertical lines and 5 horizontal lines. In contrast, it is understood that when the dehydrogenation process is performed in the chamber having 100 ppm or less of oxygen content, the striped curves generated in the polysilicon layer include 7 vertical lines and 4 horizontal lines. That is, it is understood that the curves of the surface of the polysilicon layer may be reduced by controlling the atmosphere of the dehydrogenation process.

Further, when the content of oxygen in the chamber for the dehydrogenation process is lowered to be 100 ppm or less, the film characteristic of the polysilicon layer is improved, so that the thin film transistor including the polysilicon layer may have an enhanced device characteristic. Specifically, when the film characteristic of the polysilicon layer is improved, the surface roughness value ($R_q$) of the polysilicon layer is lowered, so that a breakdown voltage of the gate insulating layer which covers the polysilicon layer may be improved.

When the content of oxygen in the chamber for the dehydrogenation process is not controlled, a large number of oxygen is adsorbed onto the surface of the amorphous silicon layer during the dehydrogenation process, so that the film characteristic of the polysilicon layer may be degraded. In this case, the polysilicon layer has a high surface roughness value ($R_q$), so that a sharp portion may be formed on the surface of the polysilicon layer. In the meantime, the gate insulating layer is formed on the polysilicon layer and the gate electrode is formed on the gate insulating layer. When a predetermined voltage is applied to the gate electrode, arc may be generated between the gate electrode and a sharp protrusion of the polysilicon layer due to the predetermined voltage. In this case, charges are gathered on the gate insulating layer in a region where the arc is generated so that dielectric breakdown may be generated on the gate insulating layer. The more the sharp portions on the surface of the polysilicon layer, the more the above-mentioned arcs. Therefore, the dielectric breakdown of the gate insulating layer may be relatively easily generated. Therefore, the gate insulating layer on the polysilicon layer having a high surface roughness value ($R_q$) has a relatively low breakdown voltage. When the gate insulating layer has a low breakdown voltage due to the high surface roughness value (Rq) of the polysilicon layer, the thin film transistor may be easily broken due to a high gate voltage. Therefore, the reliability of the thin film transistor may be degraded.

In contrast, when the content of oxygen in the chamber for performing the dehydrogenation process is reduced to 100 ppm or less, the film characteristic of the polysilicon layer is improved and the number of sharp portions on the surface of the polysilicon layer may be reduced. Accordingly, the arc between the gate electrode and the polysilicon layer is generated less and the breakdown voltage of the gate insulating layer may be improved.

Specifically, the breakdown voltage of the gate insulating layer is improved as represented in Table 2.

TABLE 2

| | Comparative embodiment | Exemplary embodiment |
|---|---|---|
| Breakdown voltage | 97.75 V | 104.5 V |

In Table 2, the thin film transistor according to the exemplary embodiment of the present disclosure is formed by forming an amorphous silicon layer with a thickness of 500 Å on a substrate with a width of 730 nm and a length of 920 nm, and performing the dehydrogenation process on the amorphous silicon layer in a chamber in which 100 ppm or less of oxygen is contained, at 430° C. for 15 minutes, and crystallizing the amorphous silicon layer using excimer laser. In contrast, the thin film transistor according to the comparative embodiment is formed by forming an amorphous silicon layer with a thickness of 500 Å on a substrate with a width of 730 nm and a length of 920 nm, performing the dehydrogenation process on the amorphous silicon layer in a chamber in which 200,000 ppm or higher of oxygen is contained, at 430° C. for 15 minutes, and crystallizing the amorphous silicon layer using excimer laser. The breakdown voltage of Table 2 is obtained by forming a gate insulating layer with a thickness of 1400 Å on the polysilicon layer formed by the above-described method using silicon oxide ($SiO_2$), forming a gate electrode with a thickness 500 Å using molybdenum (Mo), and then measuring a voltage value which is applied to the gate electrode at a moment when dielectric breakdown is generated on the gate insulating layer.

As seen from Table 2, it is understood that when the content of oxygen in the chamber for performing the dehydrogenation process is lowered to 100 ppm or less, the breakdown voltage of the gate insulating layer is 6.75 V increased as compared with the case when the content of oxygen in the chamber is not controlled. That is, when the content of oxygen in the chamber is lowered to 100 ppm or less, the breakdown voltage of the gate insulating layer is increased and the durability of the thin film transistor against the voltage may be improved.

The method of manufacturing a thin film transistor according to an exemplary embodiment of the present disclosure may reduce the content of oxygen in the chamber for performing the dehydrogenation process to a predetermined content and the content of oxygen in the chamber may be adjusted by an oxygen content control gas. Therefore, the chamber for performing the dehydrogenation process has a specific structure to easily purge the oxygen in the chamber by the oxygen content control gas. Hereinafter, a structure of a chamber for a hydrogenation process will be described with reference to FIGS. 8 to 10.

Figure 8:
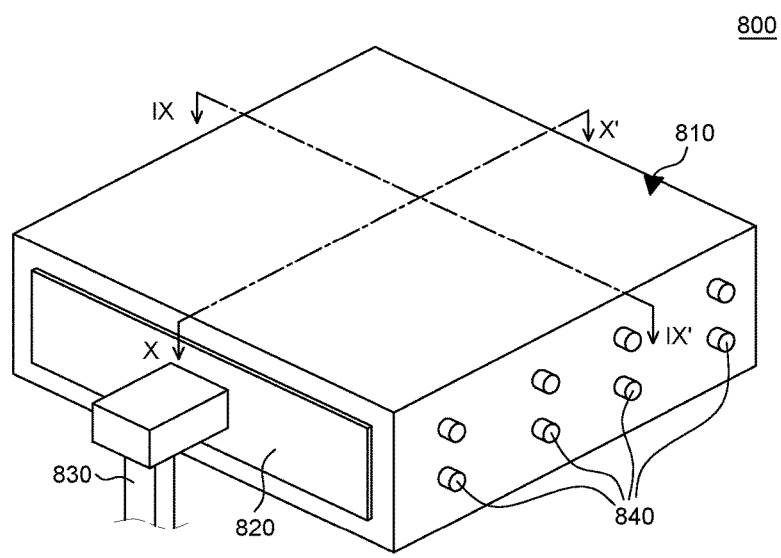
FIG. 8 is a schematic perspective view explaining a dehydrogenating apparatus for manufacturing a thin film transistor according to an exemplary embodiment of the present disclosure.
Figure 9A:
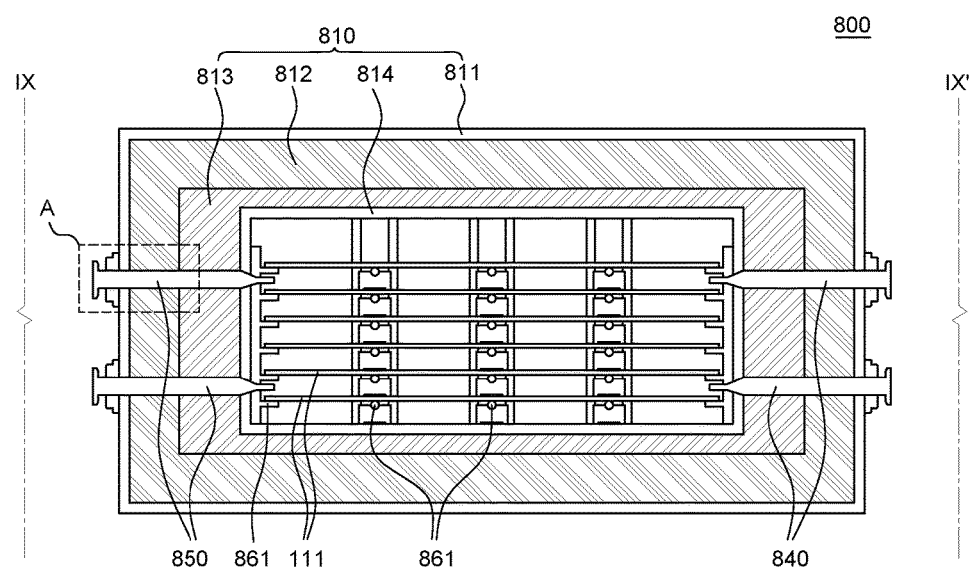
FIG. 9A is a schematic cross-sectional view taken along the line XI-XI' of FIG. 8.
Figure 9B:
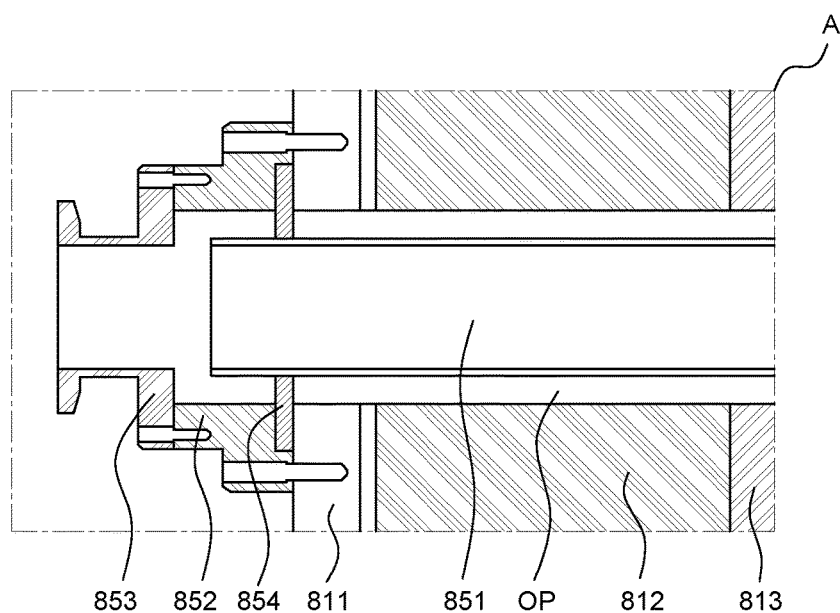
FIG. 9B is a partial enlarged cross-sectional view of a region A of FIG. 9A.
Figure 10:
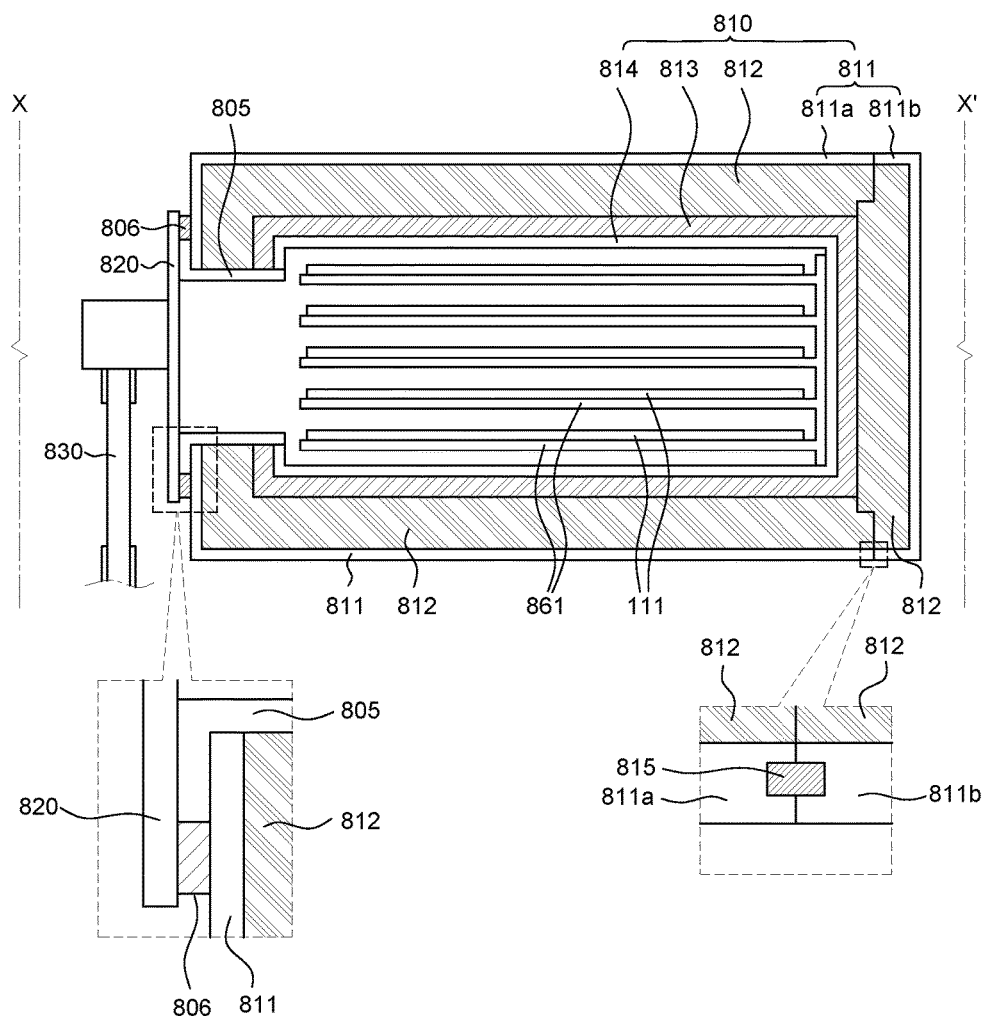
FIG. 10 is a schematic cross-sectional view taken along the line X-X' of FIG. 8.

FIG. 8 is a schematic perspective view explaining for a dehydrogenating apparatus for manufacturing a thin film transistor according to an exemplary embodiment of the present disclosure. FIG. 9A is a schematic cross-sectional view taken along the line XI-XI' of FIG. 8 and FIG. 9B is a partial enlarged cross-sectional view of a region A of FIG. 9A. FIG. 10 is a schematic cross-sectional view taken along the line X-X' of FIG. 8.

Referring to FIGS. 8 to 10, a dehydrogenating apparatus 800 for manufacturing a thin film transistor includes a chamber 810 for performing a dehydrogenation process on an amorphous silicon layer, a substrate support 861, a gas supplying unit 850, a gas exhausting unit 840, a substrate insertion slot 805, a shutter unit 820, and a shutter open/close unit 861.

As illustrated in FIGS. 9A and 10, the chamber 810 includes an outer wall 811, an inner wall 814, a heating member 812, and a heat insulating member 813. The outer wall 811 protects elements in the chamber 810. The outer wall 811 encloses the heating member 812 and is configured by a material having an enhanced heat resistance so that heat generated in the heating member 812 is not leaked to the outside.

The heating member 812 is disposed inside the outer wall 811 and heats the inside of the chamber 810. The heating member 812 includes an electric resistance heating body and is disposed to enclose a remaining region of the chamber 810 except a region where the substrate insertion slot 805 is disposed.

The heat insulating member 813 is disposed inside the heating member 812 and insulates inside the chamber 810 so that the heat in the chamber is not leaked to the outside. The heat insulating member 813 may be formed of quartz which has an enhanced heat resistance. However, the material which configures the heat insulating member 813 is not limited to quartz, but the heat insulating member 813 may be formed of various materials having an enhanced heat resistance.

The inner wall 814 defines an inner space of the chamber 810 and is disposed inside the heat insulating member 813. The inner wall 814 may be configured by a material having a high heat conductivity so as to satisfactorily transfer heat generated in the heating member 812.

The substrate support 861 supports the substrate 111 in the chamber 810. The substrate support 861 is coupled to the inner wall 814 to support one surface of the substrate 111 and is disposed along a side of the inner wall 814 so that a plurality of substrates 111 is inputted in a batch type.

The gas supplying unit 850 is disposed on one side of the chamber 810. For example, eight gas supplying units 850 are disposed on one side of the chamber 810. However, the number of gas supplying units 850 may vary depending on the size of the chamber 810.

As illustrated in FIG. 9A, the gas supplying unit 850 is disposed to penetrate the outer wall 811, the heating member 812, the heat insulating member 813, and the inner wall 814 of the chamber 810. The gas supplying unit 850 is configured to inject an oxygen content control gas so as to control the content of oxygen in the chamber 810 to a predetermined content in the dehydrogenation process. The gas supplying unit 850 is disposed to be spaced apart from one surface of the substrate 111 so that the oxygen content control gas is sprayed from one upper portion of the substrate 111 to flow to the other upper portion of the substrate 111. For example, the gas supplying unit 850 is disposed in one side of the chamber 810 corresponding to one location between the substrates 111 so as to inject the oxygen content control gas into a space between the substrates 111 which are disposed in a batch type.

The gas supplying unit 850 supplies the oxygen content control gas at an appropriate flow rate to maintain the content of oxygen in the chamber 810 at a predetermined content. For example, the gas supplying unit 850 may provide nitrogen gas ($N_2$) at a flow rate of 150 slm as an oxygen content control gas to maintain the content of oxygen in the chamber 810 to be 100 ppm or lower.

As illustrated in FIG. 9B, the gas supplying unit 850 includes an inlet 853, a penetrating unit 851, a nozzle housing 852, and a first sealing member 854.

The inlet 853 is a flange which is disposed outside of the outer wall 811 of the chamber 810 and is connected to a gas pipe which is configured to supply the oxygen content control gas. The oxygen content control gas flows into the penetrating unit 851 through the inlet 853.

The penetrating unit 851 transfers the oxygen content control gas into the chamber 810 and penetrates the chamber 810. For example, the penetrating unit 851 penetrates the outer wall 811, the heating member 812, the heat insulating member 813, and the inner wall 814 of the chamber 810. Each of the inner wall 814, the heat insulating member 813, the heating member 812, and the outer wall 811 of the chamber 810 includes a hole OP. Holes OP of the inner wall 814, the heat insulating member 813, the heating member 812, and the outer wall 811 are connected to each other to form a space so that the penetrating unit 851 is continuous in the chamber 810.

The nozzle housing 852 is disposed to enclose the penetrating unit 851 which is exposed through the outer surface of the outer wall 811 of the chamber 810 and is coupled to the outer wall 811 in the form of a ring. The inlet 853 is coupled to the nozzle housing 852 and the oxygen content control gas which flows through the inlet 853 flows to the penetrating unit 851 through the nozzle housing 852. That is, the nozzle housing 852 is configured to connect the inlet 853 and the penetrating unit 851.

The first sealing member 854 encloses the penetrating unit 851 and suppresses the gas in the chamber 810 from being carried out to the periphery of the penetrating unit 851. The first sealing member 854 may be formed of a silicon material which may provide enhanced sealing and the first sealing member 854 may be disposed between the nozzle housing 852 and the outer wall 811 to enclose the side of the penetrating unit 851.

As mentioned above, the penetrating unit 851 is connected to the inner space of the chamber through the holes OP equipped in the outer wall 811, the heating member 812, the heat insulating member 813, and the inner wall 814 of the chamber 810. The holes OP are formed to be larger than a diameter of the penetrating unit 851 in consideration of an error in the process and thus a minute gap may be generated between the holes OP and the penetrating unit 851. As mentioned above, the holes OP are formed to communicate from the inner wall 814 of the chamber to the outer wall 811, so that the gas in the chamber 810 may be leaked through the minute gap between the holes OP and the penetrating unit 851. When the first sealing member 854 is not provided, the gas in the chamber 810 may be leaked to the outside of the chamber 810 through the minute gap between the holes OP and the penetrating unit 851. Further, the oxygen content control gas may backwardly flow to be leaked. In this case, the content of oxygen in the chamber 810 may not be controlled to a predetermined content and a large amount of oxygen may be adsorbed onto the surface of the amorphous silicon layer during the dehydrogenation process. However, the first sealing member 854 seals the gap between the penetrating unit 851 and the hole OP so that the backward flowing of the oxygen content control gas in the chamber 810 may be minimized and the oxygen in the chamber 810 may be reduced to a predetermined content.

As illustrated in FIG. 9A, the gas exhausting unit 840 is disposed on one side of the chamber 810 which is opposite to the other side of the chamber 810 in which the gas supplying unit 850 is disposed. The gas exhausting unit 840 is disposed so as to correspond to the gas supplying unit 850 and eight gas exhausting units 840 are disposed on the one side of the chamber 810. In this case, the oxygen content control gas which is injected from the gas supplying unit 850 flows from an upper portion of one side of the substrate 111 to flow to the other upper portion of the substrate and discharged through the gas exhausting unit 840. The oxygen content control gas may flow above and across the substrate 111 from the one side of the chamber where the gas supplying unit 850 is located to the another side of the chamber where the gas exhausting unit 840 is located. However, the number of gas exhausting units 840 may vary depending on the size of the chamber 810. The oxygen content control gas flows in the gas inlet 850 to purge the oxygen in the chamber 810 and is discharged to the gas exhausting unit 840 together with the oxygen.

The gas exhausting unit 840 has the same structure as the gas supplying unit 850. That is, the gas exhausting unit 840 includes a penetrating unit which penetrates the inner wall 814, the heat insulating member 813, the heating member 812, and the outer wall 811 of the chamber 810, a nozzle housing which is disposed on the outer wall 811 of the chamber 810 to enclose the penetrating unit, and an inlet which is connected to the penetrating unit through the nozzle housing. The gas exhausting unit 840 is configured to exhaust at least a portion of oxygen in the chamber together with at least a portion of the injected oxygen content control gas from the chamber to control an amount of oxygen in the chamber during the dehydrogenation process.

As illustrated in FIG. 10, one sides of the outer wall 811, the heating member 812, the heat insulating member 813, and the inner wall 814 of the chamber 810 are formed with an opening. The substrate insertion slot 805 is disposed on portions of the chamber surrounding the opening. These may be portions of the outer wall 811, the heating member 812, the heat insulating member 813, and the inner wall 814 surrounding the opening in the chamber 810.

The substrate insertion slot 805 opens one side of the chamber 810 to connect the inside of the chamber 810 to the outside of the chamber 810. The inside of the chamber 810 is open through the substrate insertion slot 805 and the substrate 111 may be disposed on the substrate support 861 in the chamber through the substrate insertion slot 805.

The substrate insertion slot 805 is configured to enclose an exposed surface of an opening formed in the outer wall 811, the heating member 812, the heat insulating member 813, and the inner wall 814 of the chamber 810 and is curved to be L-shaped along the outer wall 811 on the exposed surface of the opening of the heating member 812 to enclose corners of the opening.

The shutter unit 820 is in contact with the substrate insertion slot 805 and is configured to vertically move to open and close the substrate insertion slot 805. The shutter unit 820 has a plate which blocks the substrate insertion slot 805 and is connected to the shutter open/close unit 830. The shutter unit 820 is in partially contact with a portion of the substrate insertion slot 805 which is curved to be L-shaped along the opening of the outer wall 811 of the chamber 810 and vertically moves along the outer wall 811 of the chamber 810. Thus, the shutter unit 820 is configured to move in a first direction to cover the opening in the chamber and also expose the inside of the chamber through uncovering the opening in the chamber 810.

The shutter open/close unit 830 is connected to one surface of the shutter unit 820 and vertically moves the shutter unit 820.

A second sealing member 806 is disposed to seal the gap between the shutter unit 820 and the outer wall 811 of the chamber 810 and the substrate insertion slot 805 in a state that the shutter unit 820 closes the substrate insertion slot 805. The second sealing member 806 seals a gap which may be generated between the substrate insertion slot 805 and the outer wall 811 of the chamber 810 and a gap which may be generated between the shutter unit 820 and the substrate insertion slot 805. The second sealing member 806 may be formed of a silicon material which may provide enhanced sealing and the gap which may be generated between the shutter unit 820 and the outer wall 811 and the substrate insertion slot 805 may be closely sealed by the second sealing member 806.

In this case, the flowing of hetero elements such as oxygen through the minute gap between the substrate insertion slot 805 and the outer wall 811 and the minute gap between the shutter unit 820 and the substrate insertion slot 805 during the dehydrogenation process may be minimized. That is, the second sealing member 806 seals between the shutter unit 820 and the outer wall 811 and the substrate insertion slot 805 while the substrate insertion slot 805 is closed, so that the substrate insertion slot 805 may be completely closed from the outside and the inside of the chamber 810 may be sealed from the external environment.

In the meantime, as illustrated in FIG. 10, a part of the outer wall 811 of the chamber 810 may be configured to be separated. For example, the outer wall 811 may be configured by a first part 811a and a second part 811b and the second part 811b is configured to be separated or detached from the first part 811a. When the second part 811b is separated from the first part 811a, the heating member 812 may be exposed through a part from which the second part 811b is removed and a physical space for repairing elements of the chamber 810 may be secured.

In some exemplary embodiments, a third sealing member 815 may be inserted between the first part 811a and the second part 811b of the outer wall 811. The third sealing member 815 seals a gap between the first part 811a and the second part 811b and minimizes the flowing of hetero elements such as oxygen between the first part 811a and the second part 811b. Accordingly, the inside of the chamber 810 may be more closely sealed from the external environment.

Further, in some exemplary embodiments, the chamber 810 may further include a pressure controller to reduce the pressure in the chamber to 1 atm or less. In this case, the pressure controller may lower the environment in the chamber 810 to be 1 atm or less before the dehydrogenation process and the content of oxygen in the chamber 810 may be reduced to 100 ppm or less. The pressure controller may include a vacuum pipe and a vacuum pump which penetrates the outer wall 811, the heating member 812, the heat insulating member 813, and the inner wall 814 of the chamber 810. In this case, the oxygen in the chamber 810 may be removed by the vacuum pump and the pressure in the chamber 810 may be reduced to be 1 atm or less.

A dehydrogenating apparatus 800 for manufacturing a thin film transistor according to an exemplary embodiment of the present disclosure includes a gas supplying unit 850 which is disposed on one surface of the chamber 810 to inject oxygen content control gas so as to control the content of oxygen in the chamber 810 to a predetermined content during the hydrogenation process and a gas exhausting unit 840 which is configured to exhaust the oxygen content control gas. Therefore, the content of oxygen in the chamber 810 may be maintained to a low content during the dehydrogenation process and a problem in that oxygen is adsorbed onto the surface of the silicon layer on the substrate 111 during the dehydrogenation process may be minimized.

Specifically, the gas supplying unit 850 and the gas exhausting unit 840 are spaced apart from one surface of the substrate 111 so that the oxygen content control gas flowing from the gas supplying unit 850 is sprayed from one upper portion of the substrate 111 to flow to the other upper portion of the substrate 111. Therefore, the hitting of the surface of the amorphous silicon layer by the oxygen content control gas may be minimized. If the gas supplying unit 850 and the gas exhausting unit 840 are not spaced apart from one surface of the substrate 111, the oxygen content control gas supplied from the gas supplying unit 850 may hit the surface of the amorphous silicon layer. Even though the oxygen content control gas has a low reactivity so that the oxygen content control gas is hardly adsorbed onto the surface of the amorphous silicon layer, when the oxygen content control gas consistently hits the surface of the amorphous silicon layer, it may affect the surface of the amorphous silicon layer. Further, the film characteristic of the polysilicon layer may be degraded after the laser annealing process. However, the dehydrogenating apparatus 800 according to the exemplary embodiment of the present disclosure includes the gas supplying unit 850 and the gas exhausting unit 840 which are spaced apart from one surface of the substrate 111 so that the content of oxygen in the chamber 810 may be efficiently reduced without affecting the surface of the amorphous silicon layer.

Further, the dehydrogenating apparatus 800 according to the exemplary embodiment of the present disclosure includes the first sealing member 854, the second sealing member 806, and the third sealing member 815. The first sealing member 854 suppresses the gas in the chamber 810 from backwardly flowing through the gap between the penetrating unit 851 and the hole OP in the chamber around the penetrating unit 851 of the gas supplying unit 850. The second sealing member 806 is disposed between the shutter unit 820, the outer wall 811, and the substrate insertion slot 805 to minimize the flowing of oxygen through a gap between the shutter unit 820 and the substrate insertion slot 805 or a gap between the substrate insertion slot 805 and the outer wall 811. The third sealing member 815 is disposed between the second part 811*b* and the first part 811*a* of the outer wall which are separated for repairing the chamber 810 to minimize the flowing of oxygen between the first part 811*a* and the second part 811*b*. Therefore, the content of oxygen in the chamber 810 in the dehydrogenating apparatus 800 may be efficiently reduced and the inside of the chamber 810 is disconnected from the external environment so that the dehydrogenation process may be more stably performed.

The exemplary embodiments of the present disclosure can also be described as follows:

According to an aspect of the present disclosure, a method of manufacturing a thin film transistor includes reducing a content of oxygen in a chamber for performing a dehydrogenation process of an amorphous silicon layer to a predetermined content; inputting a substrate on which the amorphous silicon layer is formed into the chamber; heating the inside of the chamber to perform the dehydrogenation process on the amorphous silicon layer; and forming a polysilicon layer by crystallizing the amorphous silicon layer using a laser. The method of manufacturing a thin film transistor according to the exemplary embodiment of the present disclosure reduces the content of oxygen in the chamber for performing a dehydrogenation process to a predetermined content. Therefore, adsorption of oxygen onto the surface of the amorphous silicon layer during the dehydrogenation process may be minimized. Therefore, the polysilicon layer formed by crystallizing the amorphous silicon layer has a low surface roughness value (Rq) and includes silicon grains with a substantially uniform size and arrangement. Accordingly, the thin film transistor formed by a polysilicon layer has an enhanced device characteristic.

The reducing of a content of oxygen in a chamber to a predetermined content includes may include injecting an oxygen content control gas in the chamber to maintain the content of oxygen in the chamber to be 100 ppm or less.

The oxygen content control gas may be nitrogen ($N_2$) gas.

The injecting of an oxygen content control gas in the chamber may include injecting the oxygen content control gas onto one upper portion of the substrate and exhausting the oxygen content control gas to the other upper portion of the substrate.

The reducing of a content of oxygen in a chamber to a predetermined content may include reducing a pressure in the chamber to 1 atm or less.

According to an aspect of the present disclosure, a dehydrogenating apparatus for manufacturing a thin film transistor includes a chamber, a substrate support, a gas supplying unit, and a gas exhausting unit. The chamber is a chamber for performing a dehydrogenation process which removes hydrogen of the amorphous silicon layer on the substrate. The substrate support is configured to support the substrate. The gas supplying unit is configured to inject an oxygen content control gas to control a content of oxygen in the chamber during the dehydrogenation process to a predetermined content. The gas exhausting unit is configured to exhaust oxygen in the chamber and the oxygen content control gas together. The dehydrogenating apparatus for manufacturing a thin film transistor according to an exemplary embodiment of the present disclosure incudes a gas supplying unit configured to inject an oxygen content control gas and a gas exhausting unit configured to exhaust oxygen with the oxygen content control gas together from the chamber. Therefore, the content of oxygen in the chamber for a dehydrogenation process is reduced to a predetermined content. Accordingly, adsorption of oxygen and hetero elements onto the surface of the amorphous silicon layer during the dehydrogenation process may be minimized and the surface roughness of the polysilicon layer formed by crystallization of the amorphous silicon layer may be improved.

The gas supplying unit may be configured to inject nitrogen gas and the gas supplying unit may be spaced apart from one surface of the substrate so that the nitrogen gas is sprayed from one upper portion of the substrate to flow to another upper portion of the substrate.

The gas supplying unit may inject the oxygen content control gas at a predetermined flow rate to maintain the content of oxygen in the chamber to be 100 ppm or less.

The hydrogenating apparatus for manufacturing a thin film transistor may further include a pressure controller configured to control a pressure in the chamber and the pressure controller may be configured to lower the pressure in the chamber to 1 atm or less so that the content of oxygen in the chamber is 100 ppm or less.

The gas supplying unit may include an inlet through which the oxygen content control gas is injected, a penetrating unit configured to transfer the oxygen content control gas to the chamber and penetrate the chamber, a nozzle housing configured to connect the penetrating unit and the inlet, and a first sealing member which seals a peripheral of the penetrating unit to suppress the gas in the chamber from backwardly flowing in the peripheral of the penetrating unit.

The hydrogenating apparatus for manufacturing a thin film transistor may further include a substrate insertion slot which opens one surface of the chamber to connect the inside of the chamber to the outside of the chamber and is in contact with the outer wall of the chamber, a shutter unit which is in contact with the substrate insertion slot and vertically moves to open/close the substrate insertion slot, and a second sealing member configured to seal a gap between the substrate insertion slot and the outer wall of the chamber and a gap between the shutter unit and the substrate insertion slot in a state where the substrate insertion slot is closed.

The hydrogenating apparatus for manufacturing a thin film transistor may further include a third sealing member. The outer wall of the chamber includes a first part and a second part which are separated from each other and the third sealing member may be disposed between the first part and the second part to seal a gap between the first part and the second part.

According to an aspect of the present disclosure, The organic light emitting display device includes: a polysilicon layer on a substrate; a gate insulating layer which covers the polysilicon layer; a gate electrode which overlaps the polysilicon layer on the gate insulating layer; an interlayer insulating layer which covers the gate insulating layer and the gate electrode; a source electrode and a drain electrode which are connected to the polysilicon layer on the interlayer insulating layer; a planarizing layer which covers the source electrode and the drain electrode; and a thin film transistor which includes an organic light emitting diode (OLED) connected to the source electrode or the drain electrode on the planarizing layer. A surface roughness value (Rq) of the polysilicon layer is 10 nm or less and the surface roughness value (Rq) of the polysilicon layer is defined by a root mean square (rms) value of height values of a curved surface of the polysilicon layer which is measured with respect to the reference plane. The organic light emitting display device according to the exemplary embodiment of the present disclosure includes a thin film transistor including a polysilicon layer with a low surface roughness value (Rq) so that a display quality may be enhanced. All the plurality of thin film transistors formed by a polysilicon layer having an enhanced film characteristic has a similar device characteristic, so that a similar driving current is supplied to the organic light emitting diode connected to the thin film transistor and organic light emitting diodes emit light at the same gray level. Accordingly, the striped stain caused by the degraded film characteristic of the polysilicon layer may be significantly reduced.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical spirit of the present disclosure. The scope of the technical spirit of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A method of manufacturing a polysilicon layer, the method comprising:
    reducing at least a portion of oxygen in a chamber to change an amount of oxygen in the chamber from a first value to a second value of 100 ppm or lower, wherein reducing at least the portion of oxygen in the chamber includes:
        injecting an oxygen content control gas into the chamber, and
        exhausting the portion of oxygen from the chamber together with at least a portion of the injected oxygen content control gas;
    inserting a substrate on which an amorphous silicon layer is formed into the chamber;
    performing a dehydrogenation process in the chamber for the amorphous silicon layer, wherein the oxygen content control gas is injected before performing the dehydrogenation process at a first flow rate, and wherein the oxygen content control gas is injected during the dehydrogenation process at a second flow rate smaller than the first flow rate; and
    crystallizing the amorphous silicon layer to form the polysilicon layer.

2. The method of claim 1, wherein the amount of oxygen in the chamber is maintained at 100 ppm or lower during at least a part of the dehydrogenation process.

3. The method of claim 1, wherein the oxygen content control gas includes nitrogen ($N_2$) gas or argon (Ar) gas.

4. The method of claim 1, wherein the oxygen content control gas is injected at a first end of the chamber and the portion of the injected oxygen content control gas is exhausted at a second end of the chamber, wherein the injected oxygen content control gas flows above and across the substrate from the first end of the chamber to the second end of the chamber.

5. The method of claim 1, wherein reducing at least the portion of oxygen in the chamber comprises reducing a pressure of gas in the chamber.

6. The method of claim 5, wherein the reduced pressure of the gas in the chamber is 1 atm or lower.

7. The method of claim 1, wherein the amorphous silicon layer is crystallized through a laser annealing process.

8. The method of claim 1, wherein performing the dehydrogenation process comprises thermally heating the amorphous silicon layer.

9. A method of forming a thin film transistor (TFT) including a gate electrode, a polysilicon layer, a gate insulation layer, a source electrode, and a drain electrode, wherein forming the polysilicon layer comprises:
    forming an amorphous silicon layer on a substrate;
    injecting an oxygen content control gas into a chamber;
    exhausting a portion of oxygen from the chamber together with at least a portion of the injected oxygen content control gas;
    inserting the substrate with the amorphous silicon layer into the chamber;
    performing a dehydrogenation process in the chamber for the amorphous silicon layer, wherein the oxygen content control gas is injected before performing the dehydrogenation process at a first flow rate, and wherein the oxygen content control gas is injected during the dehydrogenation process at a second flow rate smaller than the first flow rate; and
    crystallizing the amorphous silicon layer to form the polysilicon layer.

10. The method of claim 9, wherein an amount of oxygen in the chamber is reduced from a first value to a second value of 100 ppm or lower.

11. A method of manufacturing a display device, the method comprising:
    forming an amorphous silicon layer on a substrate to form an active layer of a thin film transistor (TFT);
    reducing an amount of oxygen in a chamber by injecting an oxygen content control gas into the chamber at a first flow rate, so that a root mean square (RMS) value of surface height values of the active layer measured with reference to a reference plane is 10 nm or less;
    inserting the substrate on which the amorphous silicon layer is formed into the chamber;
    heating the amorphous silicon layer to reduce an amount of hydrogen in the amorphous silicon layer to 1% or less as compared with an amount of hydrogen in the amorphous silicon layer before the healing the amorphous silicon layer;

crystallizing the amorphous silicon layer to form a polysilicon layer as the active layer of the TFT;

forming a gate electrode of the TFT on the polysilicon layer;

forming a source electrode and a drain electrode of TFT on the gate electrode; and forming a light emitting diode including a cathode, an emitting layer, and an anode on the TFT, the TFT comprising the polysilicon layer, the gate electrode, the source electrode, and the drain electrode.

12. The method of claim 11, wherein the oxygen content control gas includes nitrogen ($N_2$) or argon (Ar) gas.

13. The method of claim 11, wherein the oxygen content control gas is injected during the heating of the amorphous silicon layer, so that the polysilicon layer includes substantially uniform silicon crystal grains having a size of 0.13 μm to 0.75 μm.

14. The method of claim 13, wherein the oxygen content control gas is injected during the heating of the amorphous silicon layer at a second flow rate smaller than the first flow rate.

15. The method of claim 11, wherein the amount of oxygen in the chamber is reduced to 100 ppm or lower.

16. The method of claim 11, wherein the amorphous silicon layer is crystallized through irradiating a laser onto the amorphous silicon layer.

* * * * *